(12) United States Patent
Keum et al.

(10) Patent No.: US 11,501,706 B2
(45) Date of Patent: Nov. 15, 2022

(54) DISPLAY PANEL AND DISPLAY APPARATUS INCLUDING THE SAME

(71) Applicant: Samsung Display Co., Ltd., Yongin-si (KR)

(72) Inventors: Nackhyeon Keum, Yongin-si (KR); Jihyun Ka, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/469,798

(22) Filed: Sep. 8, 2021

(65) Prior Publication Data

US 2022/0208093 A1    Jun. 30, 2022

(30) Foreign Application Priority Data

Dec. 28, 2020 (KR) ........................ 10-2020-0185204

(51) Int. Cl.
*G09G 3/3225* (2016.01)
*G09G 3/00* (2006.01)
*H01L 27/32* (2006.01)

(52) U.S. Cl.
CPC .......... *G09G 3/3225* (2013.01); *G09G 3/006* (2013.01); *G09G 2300/0426* (2013.01); *G09G 2300/0452* (2013.01); *G09G 2300/0861* (2013.01); *G09G 2320/0242* (2013.01); *G09G 2330/12* (2013.01); *H01L 27/3276* (2013.01)

(58) Field of Classification Search
CPC ................. G09G 3/3225; G09G 3/006; G09G 2300/0426; G09G 2300/0452; G09G 2300/0861; G09G 2320/0242; G09G 2330/12; H01L 27/3276

See application file for complete search history.

(56) References Cited

U.S. PATENT DOCUMENTS

| 8,008,665 B2 | 8/2011 | Yang et al. |
| 8,872,736 B2 | 10/2014 | Shin |
| 9,379,139 B2 | 6/2016 | Jeon et al. |

(Continued)

FOREIGN PATENT DOCUMENTS

| KR | 10-0666549 | 1/2007 |
| KR | 10-1249984 | 4/2013 |

(Continued)

*Primary Examiner* — David Tung
(74) *Attorney, Agent, or Firm* — H.C. Park & Associates, PLC

(57) ABSTRACT

A display panel and a display apparatus, in which a particular color is prevented from being emphasized and displayed in a display area even when the display panel passes testing. The display panel includes: a substrate including a first area and a second area in which first connection nodes and second connection nodes are arranged, the first and second areas being separate from each other; first data lines on the first area; second data lines on the second area and respectively connected to second connection nodes; first connection lines respectively connecting the first data lines to the first connection nodes; a first voltage line; first transistors respectively connected between the first connection nodes and the first voltage line; second transistors respectively connected between the second connection nodes and the first voltage line; and a first gate line connected to gates of the first transistors and gates of the second transistors.

15 Claims, 13 Drawing Sheets

(56) References Cited

U.S. PATENT DOCUMENTS

| | | | | |
|---|---|---|---|---|
| 2014/0111407 | A1* | 4/2014 | Kwon | H01L 51/0031 |
| | | | | 345/82 |
| 2016/0043010 | A1* | 2/2016 | Kwak | H01L 27/124 |
| | | | | 438/15 |
| 2017/0046992 | A1* | 2/2017 | Zhou | G09G 3/006 |
| 2017/0076665 | A1* | 3/2017 | Kim | G09G 3/3275 |

FOREIGN PATENT DOCUMENTS

| | | |
|---|---|---|
| KR | 10-1985879 | 6/2019 |
| KR | 10-2129336 | 7/2020 |
| KR | 10-2141948 | 8/2020 |

\* cited by examiner

DISPLAY PANEL AND DISPLAY APPARATUS INCLUDING THE SAME

CROSS-REFERENCE TO RELATED APPLICATION

This application claims priority from and the benefit of Korean Patent Application No. 10-2020-0185204, filed on Dec. 28, 2020, which is hereby incorporated by reference for all purposes as if fully set forth herein.

BACKGROUND

Field

Embodiments of the invention relate generally to a display panel and a display apparatus including the same.

Discussion of the Background

Display apparatuses may visually display data. A display apparatus may be used as a display of a small product, such as a mobile phone, or may be used as a display of a large product, such as a television.

Such a display apparatus includes a substrate divided into a display area and a peripheral area, and a gate line and a data line are formed to be insulated from each other in the display area. A plurality of pixel regions are defined in the display area, and pixels respectively arranged in the plurality of pixel regions emit light by receiving electrical signals from a gate line and a data line intersecting each other to display an image external to the display apparatus, for viewing by a user of the display apparatus. Each pixel region (or each of the pixel regions) includes a thin film transistor and a pixel electrode electrically connected to the thin film transistor, and an opposite electrode is commonly provided for the pixel regions. The peripheral area may include various lines for transmitting electrical signals to pixels in the display area, pads to which a gate driver, a data driver, and a controller may be connected, a test circuit used to test the display apparatus, and the like.

Recently, display apparatuses have been used for various purposes. Also, as display apparatuses have become thinner and lighter, their range of use has widened. As the number of users thereof has increased, research has been actively conducted to visually satisfy the users.

The above information disclosed in this Background section is only for understanding of the background of the inventive concepts, and, therefore, it may contain information that does not constitute prior art.

SUMMARY

Devices constructed according to illustrative implementations of the invention are capable of displaying images of different colors in which no particular color is emphasized over other colors being displayed at the same time.

In order to solve various problems, one or more embodiments include a display panel and a display apparatus including the same, in which a particular color is prevented from being emphasized and displayed in a display area even when the display panel or the display apparatus operates normally when the display panel or the display apparatus is tested. However, these problems are merely examples and the scope of the one or more embodiments described herein is not limited thereto.

Additional features of the inventive concepts will be set forth in the description which follows, and in part will be apparent from the description, or may be learned by practice of the inventive concepts.

According to one or more embodiments, a display panel includes a substrate including a first area and a second area in which a plurality of first connection nodes and a plurality of second connection nodes are arranged, the first and second areas being separate from each other, a plurality of first data lines extending in a column direction on the first area, a plurality of second data lines extending in the column direction on the second area and respectively connected to the plurality of second connection nodes, a plurality of first connection lines respectively connecting the plurality of first data lines to the plurality of first connection nodes, a first voltage line including a first portion and a second portion spaced apart from each other in the column direction, a plurality of first transistors respectively connected between the plurality of first connection nodes and the first portion of the first voltage line, a plurality of second transistors respectively connected between the plurality of second connection nodes and the second portion of the first voltage line, and a first gate line connected to gates of the plurality of first transistors and gates of the plurality of second transistors.

A first end portion of the first portion of the first voltage line may be arranged to receive a first voltage, and a second end portion of the first portion of the first voltage line may be connected to the second portion of the first voltage line.

Each of the plurality of first connection lines may include a first portion extending in a row direction, and a second portion extending in the column direction.

The display panel may further include a second voltage line including a first portion and a second portion spaced apart from each other in the column direction, a plurality of third transistors respectively connected between the plurality of first connection nodes and the first portion of the second voltage line, a plurality of fourth transistors respectively connected between the plurality of second connection nodes and the second portion of the second voltage line, and a second gate line commonly connected to gates of the plurality of third transistors and gates of the plurality of fourth transistors.

A first end portion of the first portion of the second voltage line may be arranged to receive a second voltage, and a second end portion of the first portion of the second voltage line may be connected to the second portion of the second voltage line.

A plurality of first gate signals for turning on the plurality of first transistors and the plurality of second transistors may be applied to the first gate line, a plurality of second gate signals for turning on the plurality of third transistors and the plurality of fourth transistors may be applied to the second gate line, and the plurality of first gate signals and the plurality of second gate signals may be applied alternately in time with respect to each other.

The display panel may further include a plurality of first pixels respectively connected to the plurality of first data lines and the plurality of second data lines and emitting light of a first color, and a plurality of second pixels respectively connected to the plurality of first data lines and the plurality of second data lines and emitting light of a second color, wherein the plurality of first pixels and the plurality of second pixels may be alternately arranged in the column direction.

A plurality of third connection nodes and a plurality of fourth connection nodes may be further arranged in the second area, and the display panel may further include a plurality of third data lines extending in the column direction on the first area, a plurality of fourth data lines extending in the column direction on the second area and respectively connected to the plurality of fourth connection nodes, a plurality of second connection lines respectively connecting the plurality of third data lines to the plurality of third connection nodes, a third voltage line connected to each of the plurality of third data lines and the plurality of fourth data lines, a plurality of fifth transistors respectively connected between the plurality of third connection nodes and the third voltage line, a plurality of sixth transistors respectively connected between the plurality of fourth connection nodes and the third voltage line, and a third gate line connected to gates of the plurality of fifth transistors and gates of the plurality of sixth transistors.

The display panel may further include a plurality of first pixels respectively connected to the plurality of first data lines and the plurality of second data lines and emitting light of a first color, and a plurality of third pixels respectively connected to the plurality of third data lines and the plurality of fourth data lines and emitting light of a third color, wherein the plurality of first pixels and the plurality of third pixels may be alternately arranged in a row direction.

A plurality of fifth connection nodes and a plurality of sixth connection nodes may be further arranged in the second area, and the display panel may further include a plurality of fifth data lines extending in the column direction on the first area, a plurality of sixth data lines extending in the column direction on the second area and respectively connected to the plurality of sixth connection nodes, a plurality of third connection lines respectively connecting the plurality of fifth data lines to the plurality of fifth connection nodes, a second voltage line including a first portion and a second portion spaced apart from each other in the column direction, a plurality of seventh transistors respectively connected between the plurality of fifth connection nodes and the first portion of the second voltage line, and a plurality of eighth transistors respectively connected between the plurality of sixth connection nodes and the second portion of the second voltage line, wherein the first gate line may be commonly connected to gates of the plurality of seventh transistors and gates of the plurality of eighth transistors.

The plurality of first data lines and the plurality of fifth data lines may be alternately arranged in a row direction, and the plurality of second data lines and the plurality of sixth data lines may be alternately arranged in the row direction.

The display panel may further include a plurality of first pixels respectively connected to the plurality of first data lines and the plurality of second data lines and emitting light of a first color, and a plurality of second pixels respectively connected to the plurality of fifth data lines and the plurality of sixth data lines and emitting light of a second color.

The display panel may further include a plurality of third transistors respectively connected between the plurality of first connection nodes and the first portion of the second voltage line, a plurality of fourth transistors respectively connected between the plurality of second connection nodes and the second portion of the second voltage line, a plurality of ninth transistors respectively connected between the plurality of fifth connection nodes and the first portion of the first voltage line, a plurality of tenth transistors respectively connected between the plurality of sixth connection nodes and the second portion of the first voltage line, and a second gate line commonly connected to gates of the plurality of third transistors, gates of the plurality of fourth transistors, gates of the plurality of ninth transistors, and gates of the plurality of tenth transistors.

The substrate may further include a third area spaced apart from the first area by the second area, a plurality of seventh connection nodes and a plurality of eighth connection nodes may be further arranged in the second area, the first voltage line may further include a third portion spaced apart from the second portion in the column direction, and the display panel may further include a plurality of seventh data lines extending in the column direction on the third area, a plurality of eighth data lines extending in the column direction on the second area and respectively connected to the plurality of eighth connection nodes, a plurality of fourth connection lines respectively connecting the plurality of seventh data lines to the plurality of seventh connection nodes, a plurality of eleventh transistors respectively connected between the plurality of seventh connection nodes and the third portion of the first voltage line, and a plurality of twelfth transistors respectively connected between the plurality of eighth connection nodes and the second portion of the first voltage line, wherein the first gate line may be commonly connected to gates of the plurality of eleventh transistors and gates of the plurality of twelfth transistors.

The display panel may further include a second voltage line including a first portion, a second portion spaced apart from the first portion in the column direction, and a third portion spaced apart from the second portion in the column direction, a plurality of third transistors respectively connected between the plurality of first connection nodes and the first portion of the second voltage line, a plurality of fourth transistors respectively connected between the plurality of second connection nodes and the second portion of the second voltage line, a plurality of thirteenth transistors respectively connected between the plurality of seventh connection nodes and the third portion of the second voltage line, a plurality of fourteenth transistors respectively connected between the plurality of eighth connection nodes and the second portion of the second voltage line, and a second gate line commonly connected to gates of the plurality of third transistors, gates of the plurality of fourth transistors, gates of the plurality of thirteenth transistors, and gates of the plurality of fourteenth transistors.

According to one or more embodiments, a display apparatus includes a display unit, a test circuit, and a controller, wherein the display unit includes a substrate including a first area and a second area, the first and second areas being separate from each other, a plurality of first data lines extending in a column direction on the first area, and a plurality of second data lines extending in the column direction on the second area, the test circuit includes a first voltage line including a first portion and a second portion spaced apart from each other in the column direction, a plurality of first transistors respectively connected between the plurality of first data lines and the first portion of the first voltage line, and a plurality of second transistors respectively connected between the plurality of second data lines and the second portion of the first voltage line, and the controller is configured to turn off the plurality of first transistors and the plurality of second transistors while the display unit displays an image.

The test circuit may further include a second voltage line comprising a first portion and a second portion spaced apart from each other in the column direction, a plurality of third transistors respectively connected between the plurality of first data lines and the first portion of the second voltage line, and a plurality of fourth transistors respectively connected between the plurality of second data lines and the second portion of the second voltage line, and the controller may be configured to turn off the plurality of third transistors and the plurality of fourth transistors while the display unit displays an image.

The display unit may further include a plurality of third data lines extending in the column direction on the first area, and a plurality of fourth data lines extending in the column direction on the second area, the test circuit may further include a third voltage line connected to each of the plurality of third data lines and the plurality of fourth data lines, a plurality of fifth transistors respectively connected between the plurality of third data lines and the third voltage line, and a plurality of sixth transistors respectively connected between the plurality of fourth data lines and the third voltage line, and the controller may be configured to turn off the plurality of fifth transistors and the plurality of sixth transistors while the display unit displays an image.

The display unit may further include a plurality of fifth data lines extending in the column direction on the first area, and a plurality of sixth data lines extending in the column direction on the second area, the test circuit may further include a plurality of seventh transistors respectively connected between the plurality of fifth data lines and the first portion of the second voltage line, and a plurality of eighth transistors respectively connected between the plurality of sixth data lines and the second portion of the second voltage line, and the controller may be configured to turn off the plurality of seventh transistors and the plurality of eighth transistors while the display unit displays an image.

The test circuit may further include a plurality of ninth transistors respectively connected between the plurality of fifth data lines and the first portion of the first voltage line, and a plurality of tenth transistors respectively connected between the plurality of sixth data lines and the second portion of the first voltage line, and the controller may be configured to turn off the plurality of ninth transistors and the plurality of tenth transistors while the display unit displays an image.

These general and particular aspects may be implemented by using systems, methods, computer programs, or any combinations of systems, methods, and computer programs.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
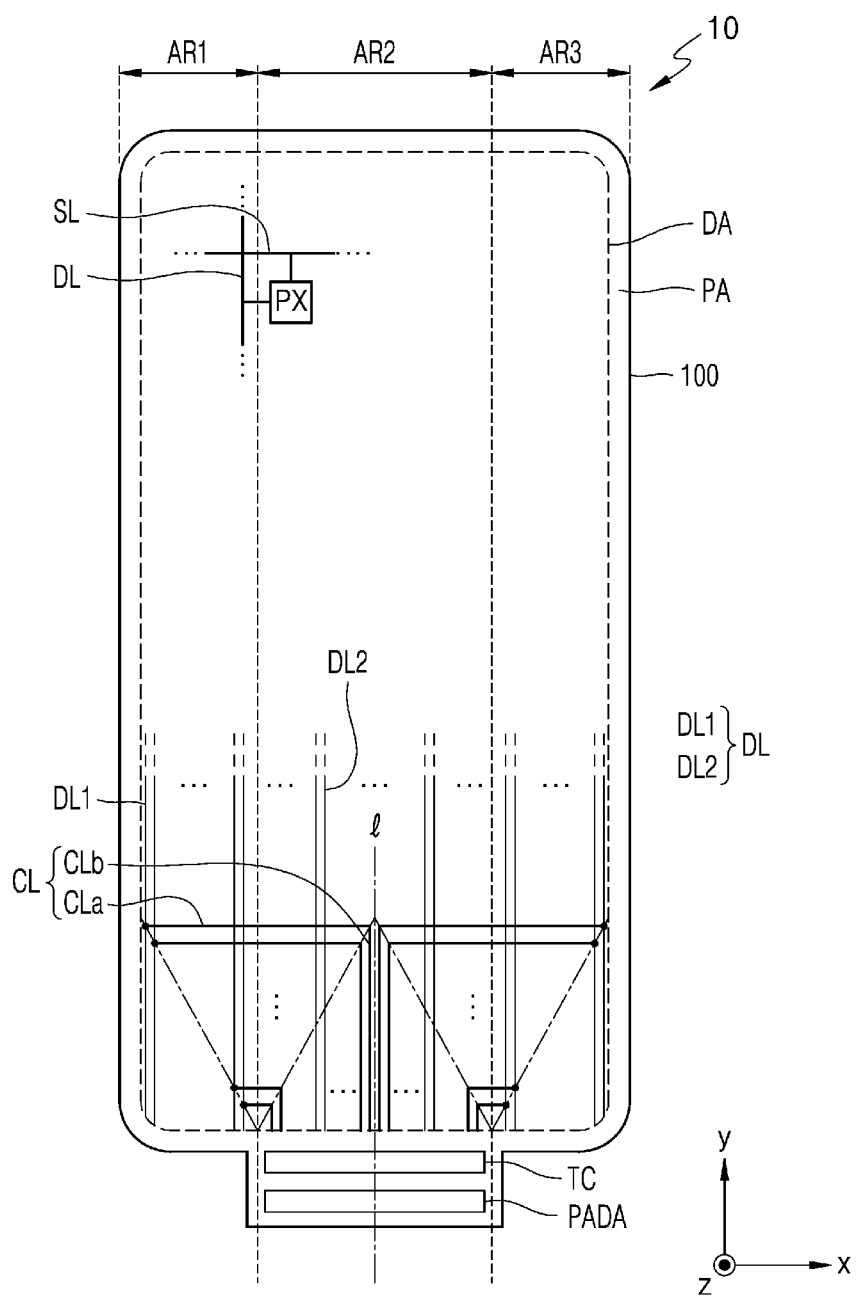
FIG. 1 is a plan view schematically illustrating a display panel according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" is another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view schematically illustrating a display panel according to an embodiment that is constructed according to principles of the invention.

Referring to FIG. 1, a display panel 10 may include a display area DA and a peripheral area PA located outside the display area DA. The display panel 10 may provide an image to the outside by using light emitted from the display area DA. Because the display panel includes a substrate 100, it may be said that the substrate 100 may include the display area DA and the peripheral area PA.

The substrate 100 may include various materials such as glass, metal, or plastic. According to an embodiment, the substrate 100 may include a flexible material. Here, the flexible material may refer to a substrate that may be easily bent, curved, folded, or rolled. The substrate 100 of the flexible material may include ultra-thin glass, metal, or plastic.

Pixels PX including various display elements such as organic light emitting diodes (OLED) may be arranged in the display area DA of the substrate 100. The pixels PX may be arranged in various forms such as stripe arrangement, pentile arrangement, and mosaic arrangement to implement an image.

The display area DA may have a planar shape of a rounded rectangle as illustrated in FIG. 1. In other embodiments, the planar shape of the display area DA may be a polygonal shape such as a tetragonal, triangular, pentagonal, or hexagonal shape, a circular shape, an elliptical shape, an atypical shape, or the like.

The peripheral area PA may surround the display area DA. The peripheral area PA may be an area in which the pixels PX are not arranged, and a pad area PADA including various lines for transmitting an electrical signal to be applied to the display area DA and pads to which a printed circuit board or a driver IC chip is attached may be located in the peripheral area PA. The pads may be electrically connected to a data driver.

In an embodiment, the data driver supplying a data signal may be arranged on a film electrically connected to the pads on the pad area PADA by a chip-on-film (COF) method. According to other embodiments, the data driver may be directly arranged on the substrate 100 by a chip-on-glass (COG) or chip-on-plastic (COP) method.

A test circuit TC may be arranged in the peripheral area PA. The test circuit TC may be driven to check whether the pixels PX of the display area DA operate normally. The test circuit TC may include a plurality of transistors, a plurality of voltage lines, and a plurality of gate lines. This will be described below with reference to FIGS. 3A to 9A.

Moreover, signal lines through which electrical signals may be applied to the pixels PX may be located in the display area DA.

As described below with reference to FIG. 2, each of the pixels PX may include a display element and a pixel circuit for driving the display element. For example, the display element may be an organic light emitting diode, and the pixel circuit may include transistors and a storage capacitor. The pixels PX may include first pixels emitting light of a first color, second pixels emitting light of a second color, and third pixels emitting light of a third color. For example, the first color may be red (R), the second color may be blue (B), and the third color may be green (G).

The signal lines through which electrical signals may be applied to the pixels PX may include scan lines SL and data lines DL. Each of the data lines DL may extend in a column direction (e.g., ±y direction), and each of the scan lines SL may extend in a row direction (e.g., ±x direction).

The scan lines SL may be arranged, for example, in a plurality of rows to transmit scan signals to the pixels PX, and the data lines DL may be arranged, for example, in a plurality of columns to transmit data signals to the pixels PX. Each of the pixels PX may be connected to at least one corresponding scan line SL among the scan lines SL and a corresponding data line DL among the data lines DL.

In an embodiment, the display panel 10 may include a first area AR1, a second area AR2, and a third area AR3. The first area AR1 and the third area AR3 may be spaced apart from each other with the second area AR2 therebetween. Because the display panel 10 includes the substrate 100, it may be said that the substrate 100 may include the first area AR1, the second area AR2, and the third area AR3.

Each of the first area AR1, the second area AR2, and the third area AR3 may overlap at least a portion of the display area DA. Each of the first area AR1, the second area AR2, and the third area AR3 may overlap at least a portion of the peripheral area PA.

The first area AR1 and a portion of the second area AR2 located on the left side of a virtual line l passing through approximately the center of the display panel 10 in the row direction (e.g., ±x direction), and another portion of the second area AR2 and the third area AR3 located on the right side of the virtual line l may be approximately horizontally symmetrical with respect to the virtual line l.

Hereinafter, a description will be given based on the first area AR1 and a portion of the second area AR2 located on the left side of the virtual line f, and another portion of the second area AR2 and the third area AR3 located on the right side of the virtual line l may also be applied in the same manner.

As illustrated in FIG. 1, the data lines DL may include first data lines DL1 extending in the column direction (e.g., ±y direction) on the first area AR1 and second data lines DL2 extending in the column direction (e.g., ±y direction) on the second area AR2.

The first data lines DL1 may be respectively connected to connection lines CL. The connection lines CL may be configured to respectively transmit electrical signals supplied from the pads arranged in the pad area PADA to the first data lines DL1. For example, data signals may be respectively applied to the first data lines DL1 through the connection lines CL. In this case, fan-out lines respectively connected to the first data lines DL1 may be omitted.

Thus, a portion of the peripheral area PA in which the fan-out lines are arranged may be removed. Because the area of the peripheral area PA may be reduced by the area in which the fan-out lines are arranged, the dead area of the display panel 10 may be reduced.

One end of each of the connection lines CL may be connected to a corresponding is first data line DL1 among the first data lines DL1, and the other end of each of the connection lines CL may be connected to a corresponding pad among the pads of the pad area PADA. In an embodiment, the other end of each of the connection lines CL may be connected to a corresponding pad among the pads of the pad area PADA through a separate bridge line. For example, the bridge line may be a portion in which the connection line CL extends toward the peripheral area PA. As another example, the bridge line may be a separate line arranged on a different layer than the connection line CL and may be electrically connected to the connection line CL in the peripheral area PA.

Each of the connection lines CL may include a first portion CLa and a second portion CLb.

The first portion CLa of each of the connection lines CL may extend in the row direction (e.g., ±x direction) and may be connected to each of the corresponding first data lines DL1. The first portion CLa of each of the connection lines CL may be parallel to the scan line SL.

Although FIG. 1 illustrates that the first portion CLa of each of the connection lines CL is directly connected to each of the corresponding first data lines DL1, this is merely an embodiment. As another example, each of the connection lines CL may further include a third portion, and the third portion of the connection line CL may be connected between the first data line DL1 and the first portion CLa of the connection line CL. The third portion of the connection line CL may be symmetrical to the second portion CLb of the connection line CL with respect to the first portion CLa of the connection line CL. In this case, the first data line DL1 and the third portion of the connection line CL may be connected at the boundary between the display area DA and the peripheral area PA.

At least a portion of the first portion CLa of each of the connection lines CL may overlap the first area AR1, and at least another portion of the first portion CLa of each of the connection lines CL may overlap the second area AR2.

The second portion CLb of each of the connection lines CL may be arranged on the side of the virtual line l. As illustrated in FIG. 1, the second portion CLb of each of the connection lines CL may overlap the second area AR2 and therefore may be located adjacent to the second data line DL2. The second portion CLb of each of the connection lines CL may extend in the column direction (e.g., ±y direction) to be away from the pad area PADA. The second portion CLb of each of the connection lines CL may be parallel to the data line DL.

The second data lines DL2 may be data lines other than the first data lines DL1. The second data lines DL2 may be connected to a corresponding pad among the pads of the pad area PADA.

In an embodiment, each of the second data lines DL2 may be connected to a corresponding pad among the pads of the pad area PADA through a separate bridge line. For example, the bridge line may be a portion in which the second data line DL2 extends toward the peripheral area PA. As another example, the bridge line may be a separate line arranged on a different layer than the second data line DL2 and may be electrically connected to the second data line DL2 in the peripheral area PA.

Figure 2:
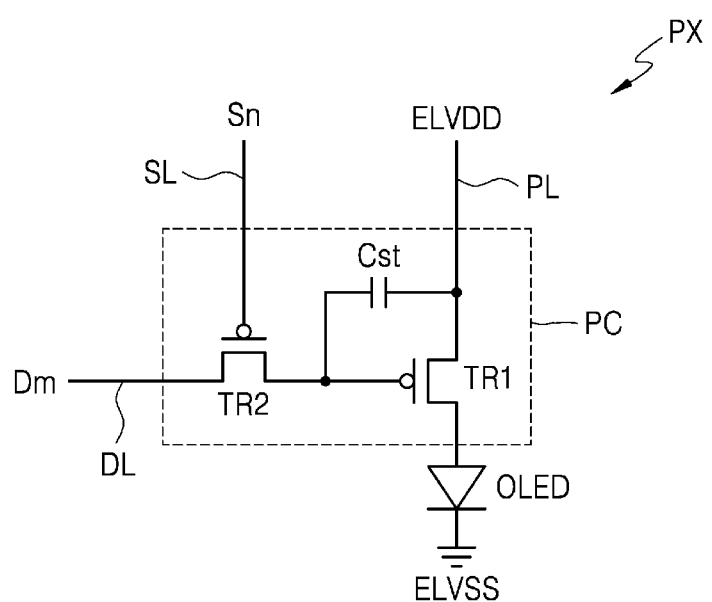
FIG. 2 is an equivalent circuit diagram schematically illustrating a pixel of a display panel according to an embodiment.

FIG. 2 is an equivalent circuit diagram schematically illustrating a pixel of a display panel according to an embodiment.

Referring to FIG. 2, a pixel PX may include a pixel circuit PC connected to a scan line SL and a data line DL and an organic light emitting diode OLED connected to the pixel circuit PC.

The pixel circuit PC may include a driving transistor TR1, a scan transistor TR2, and a storage capacitor Cst. The driving transistor TR1 and the scan transistor TR2 may include thin film transistors.

The scan transistor TR2 may be connected to the scan line SL and the data line DL and may be configured to transmit a data voltage Dm input through the data line DL to the driving transistor TR1 in synchronization with a scan signal Sn input through the scan line SL.

The storage capacitor Cst may be connected to the scan transistor TR2 and a driving voltage line PL and may store a voltage corresponding to the difference between the data voltage Dm received from the scan transistor TR2 and a driving voltage ELVDD applied to the driving voltage line PL.

The driving transistor TR1 may be connected to the driving voltage line PL and the storage capacitor Cst and may control the level of a driving current flowing from the driving voltage line PL through the organic light emitting diode OLED in response to a voltage value stored in the storage capacitor Cst. The organic light emitting diode OLED may emit light with a brightness corresponding to the level of the driving current by the driving current.

Although FIG. 2 illustrates an example in which the pixel circuit PC includes two transistors and one storage capacitor, the embodiment is not limited thereto. For example, the pixel circuit PC may include three or more transistors and/or two or more storage capacitors. In an embodiment, the pixel circuit PC may include seven transistors and one storage capacitor.

Figure 3A:
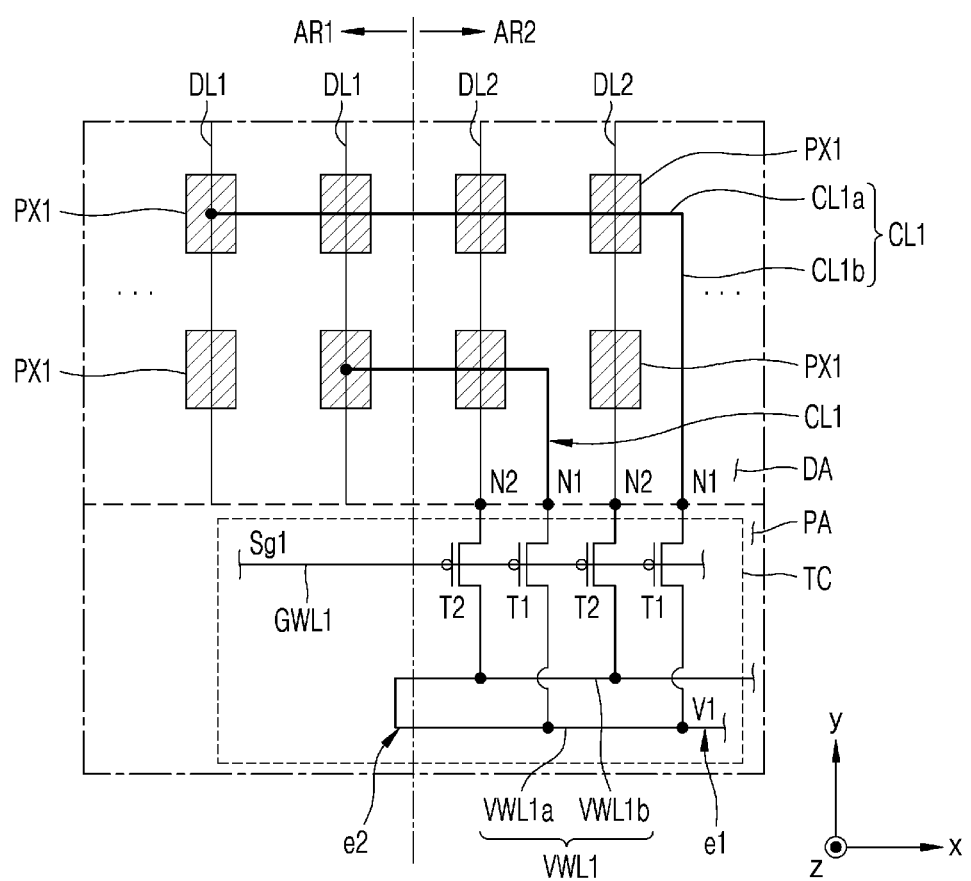
FIGS. 3A and 3B are enlarged plan views schematically illustrating a display panel according to an embodiment.
Figure 3B:
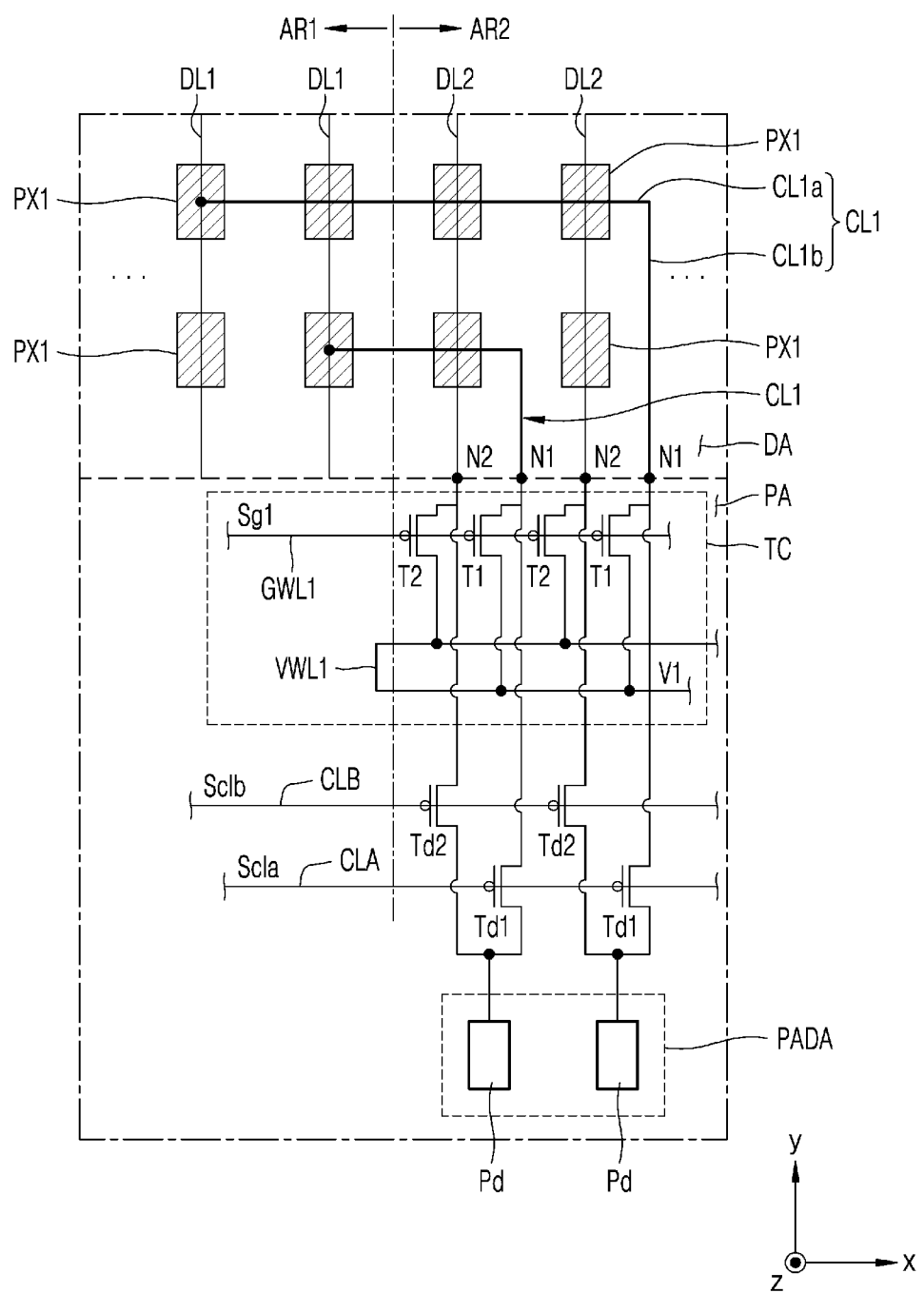

FIGS. 3A and 3B are enlarged plan views schematically illustrating a display panel according to an embodiment. Particularly, FIG. 3A is an enlarged view of a portion of the first area AR1, a portion of the second area AR2, and the test circuit TC of the display panel 10 of FIG. 1, and FIG. 3B further includes the pad area PADA unlike FIG. 3A.

Referring to FIG. 3A, the display panel 10 may include a first area AR1 and a second area AR2. Each of the first area AR1 and the second area AR2 may overlap at least a portion of the display area DA and may overlap at least a portion of the peripheral area PA.

A plurality of first data lines DL1 extending in the column direction (e.g., ±y direction) may be arranged on the first area AR1. A plurality of first pixels PX1 respectively connected to the first data lines DL1 and emitting light of the first color may be arranged on the first area AR1.

A plurality of second data lines DL2 extending in the column direction (e.g., ±y direction) may be arranged on the second area AR2. A plurality of first pixels PX1 respectively connected to the second data lines DL2 and emitting light of the first color may be arranged on the second area AR2.

A plurality of first connection nodes N1 and a plurality of second connection nodes N2 may be arranged in the second area AR2. The first connection nodes N1 may be respectively connected to the first data lines DL1, and the second connection nodes N2 may be respectively connected to the second data lines DL2.

A plurality of first connection lines CL1 respectively connecting the first data lines DL1 to the first connection nodes N1 may be arranged on the first area AR1 and the second area AR2. The first connection lines CL1 may respectively correspond to the connection lines CL illustrated in FIG. 1 described above. Moreover, unlike the first data lines DL1, the second data lines DL2 and the second connection nodes N2 may be directly connected without separate connection lines.

Each of the first connection lines CL1 may include a first portion CL1a and a second portion CL1b. The first portion CL1a of each of the first connection lines CL1 may is extend in the row direction (e.g., ±x direction), and the second portion CL1b of each of the first connection lines CL1 may extend in the column direction (e.g., ±y direction).

For example, the first portion CL1a of each of the first connection lines CL1 may extend in the row direction (e.g., ±x direction) from a corresponding first data line DL1 among the first data lines DL1. The second portion CL1b of each of the first connection lines CL1 may extend in the column direction (e.g., ±y direction) to a corresponding first connection node N1 among the first connection nodes N1.

In an embodiment, the length of the first connection line CL1 connected to the first data line DL1 may increase as the first data line DL1 is more spaced apart from the second area AR2. The length of the first connection line CL1 connected to the first data line DL1 may decrease as the first data line DL1 is more adjacent to the second area AR2. The distance of the first data line DL1 from the second area AR2 and the length of the first connection line CL1 connected to the first data line DL1 may be proportional to each other.

In other words, as the first data line DL1 is more spaced apart from the second area AR2, the first connection node N1 connected to the first data line DL1 may be more spaced apart from the first area AR1. As the first data line DL1 is more adjacent to the second area AR2, the first connection node N1 connected to the first data line DL1 may be more adjacent to the first area AR1. The distance of the first data line DL1 from the second area AR2 and the distance of the first connection node N1 connected to the first data line DL1 from the first area AR1 may be proportional to each other.

A test circuit TC may be arranged in the peripheral area PA. The test circuit TC may include a first voltage line VWL1, a plurality of first transistors T1, a plurality of second transistors T2, and a first gate line GWL1.

The first voltage line VWL1 may include a portion that is bent at least one time. For example, as illustrated in FIG. 3A, the first voltage line VWL1 may include a first portion VWL1a and a second portion VWL1b that are spaced apart from each other in the column direction (e.g., ±y direction).

A first end portion e1 of the first portion VWL1a of the first voltage line VWL1 may be arranged to receive a first voltage V1, and a second end portion e2 of the first portion VWL1a of the first voltage line VWL1 may be connected to the second portion VWL1b of the first voltage line VWL1. During the test of the display panel 10, the first end portion e1 of the first portion VWL1a of the first voltage line VWL1 may receive the first voltage V1 and the first voltage V1 may be used to check whether the first pixels PX1 operate normally. On the other hand, while the display panel 10 is not tested, the first end portion e1 of the first portion VWL1a of the first voltage line VWL1 may not receive the first voltage V1.

In an embodiment, each of the first portion VWL1*a* of the first voltage line VWL1 and the second portion VWL1*b* of the first voltage line VWL1 may extend in the row direction (e.g., ±x direction).

The first transistors T1 may be respectively connected between the first connection nodes N1 and the first portion VWL1*a* of the first voltage line VWL1. The second transistors T2 may be respectively connected between the second connection nodes N2 and the second portion VWL1*b* of the first voltage line VWL1. Although FIG. 3A illustrates that the first transistors T1 and the second transistors T2 are p-type MOSFETs, the first transistors T1 and the second transistor T2 may be n-type MOSFETs.

The first gate line GWL1 may be commonly connected to the gates of the first transistors T1 and the gates of the second transistors T2. The first transistors T1 and the second transistors T2 may be thin film transistors for testing to check whether the first pixels PX1 of the display area DA operate normally in the process of manufacturing the display panel 10. During the test of the display panel 10, a plurality of first gate signals Sg1 for turning on the first transistors T1 and the second transistors T2 may be applied to the first gate line GWL1.

In an embodiment, the first data lines DL1 may be connected to the first voltage line VWL1 to be more adjacent to the first end portion e1 of the first portion VWL1*a* of the first voltage line VWL1 to which the first voltage V1 is applied, than the second data lines DL2.

The first data lines DL1 may be connected to the first portion VWL1*a* of the first voltage line VWL1 through the first connection lines CL1 and the first transistors T1, and the second data lines DL2 may be connected to the second portion VWL1*b* of the first voltage line VWL1 through the second transistors T2. During the test of the display panel 10, because the first voltage V1 is applied from the first end portion e1 of the first portion VWL1*a* of the first voltage line VWL1, the first data lines DL1 may be connected to the first voltage line VWL1 to be more adjacent to the first end portion e1 of the first portion VWL1*a* of the first voltage line VWL1 to which the first voltage V1 is applied, than the second data lines DL2.

As illustrated in FIG. 3A, the first data lines DL1 may be arranged farther from the first voltage line VWL1 than the second data lines DL2. However, because the first data lines DL1 may be connected to the first voltage line VWL1 to be more adjacent to the first end portion e1 of the first portion VWL1*a* of the first voltage line VWL1 to which the first voltage V1 is applied, than the second data lines DL2, a voltage drop generated during the transmission of the first voltage V1 to the first data lines DL1 and a voltage drop generated during the transmission of the first voltage V1 to the second data lines DL2 may be similar to each other.

That is, the distance from the first portion VWL1*a* of the first voltage line VWL1 through the first connection lines CL1 to the first data lines DL1 may be similar to the distance from the second portion VWL1*b* of the first voltage line VWL1 to the second data lines DL2.

Although the first data lines DL1 and the second data lines DL2 have been compared with each other, the same may also be applied between the first data lines DL1. For example, the first data lines DL1 much spaced apart from the second area AR2 may be connected to the first voltage line VWL1 to be more adjacent to the first end portion e1 of the first portion VWL1*a* of the first voltage line VWL1 to which the first voltage V1 is applied, than the first data lines DL1 adjacent to the second area AR2.

Moreover, referring to FIG. 3B, a pad area PADA may be located in the peripheral area PA. The pad area PADA may include a plurality of data pads Pd. The data pads Pd may be electrically connected to the data driver. The data pads Pd may be configured to respectively transmit data voltages generated by the data driver, to the display panel 10.

Also, a first selection line CLA, a second selection line CLB, a plurality of first selection transistors Td1, and a plurality of second selection transistors Td2 may be arranged in the peripheral area PA.

The first selection transistors Td1 may be respectively connected between the first connection nodes N1 and the data pads Pd. The second selection transistors Td2 may be respectively connected between the second connection nodes N2 and the data pads Pd. Although FIG. 3B illustrates that the first selection transistors Td1 and the second selection transistors Td2 are p-type MOSFETs, the first selection transistors Td1 and the second selection transistor Td2 may be n-type MOSFETs.

The first selection line CLA may be connected to the gates of the first selection transistors Td1, and the second selection line CLB may be connected to the gates of the second selection transistors Td2.

A plurality of first selection signals Scla for turning on the first selection transistors Td1 may be applied to the first selection line CLA, and a plurality of second selection signals Sclb for turning on the second selection transistors Td2 may be applied to the second selection line CLB. In an embodiment, the first selection signals Scla and the second selection signals Sclb may be applied alternately with each other.

When the first selection transistors Td1 are respectively turned on in response to the first selection signals Scla, first data voltages transmitted through the data pads Pd may be respectively applied to the first connection nodes N1. The first data voltages may be respectively applied to the first data lines DL1 through first connection lines CL1 connected to the first connection nodes N1.

When the second selection transistors Td2 are respectively turned on in response to the second selection signals Sclb, second data voltages transmitted through the data pads Pd may be respectively applied to the second connection nodes N2. The second data voltages may be respectively applied to the second data lines DL2 connected to the second connection nodes N2.

FIG. 3B illustrates that the first selection transistor Td1 and the second selection transistor Td2 are connected to one data pad Pd; however, in other embodiments, one selection transistor may be connected to one data pad Pd. In other embodiments, three or more selection transistors may be connected to one data pad Pd.

FIG. 3B illustrates that the first data lines DL1 and the second data lines DL2 are respectively connected to the data pads Pd regardless of the positions of the first data lines DL1 and the second data lines DL2 (e.g., the order in the +x direction); however, in other embodiments, the first data lines DL1 and the second data lines DL2 may be respectively connected to the data pads Pd in the same order as the arrangement order of the first data lines DL1 and the second data lines.

Also, FIG. 3B illustrates that the test circuit TC is arranged between the display area DA and the pad area PADA; however, in other embodiments, the pad area PADA may be arranged between the display area DA and the test circuit TC.

Figure 4:
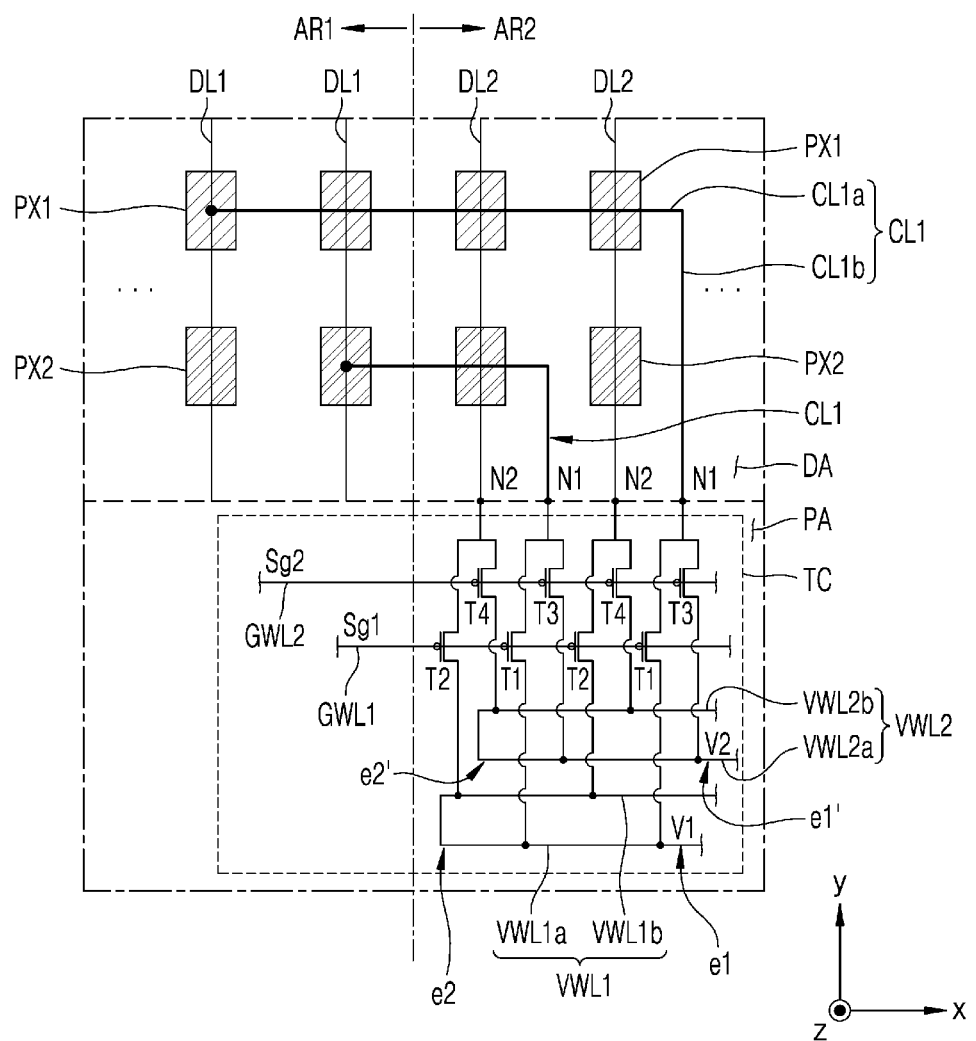
FIG. 4 is an enlarged plan view schematically illustrating a display panel according to other embodiments.

FIG. 4 is an enlarged plan view schematically illustrating a display panel according to other embodiments. FIG. 4 is a modification of FIG. 3A, redundant descriptions thereof with respect to those of FIG. 3A will be omitted for conciseness, and differences therebetween will be mainly described below.

Referring to FIG. 4, a plurality of first pixels PX1 emitting light of the first color and a plurality of second pixels PX2 emitting light of the second color, which are respectively connected to the first data lines DL1, may be arranged on the first area AR1.

A plurality of first pixels PX1 emitting light of the first color and a plurality of second pixels PX2 emitting light of the second color, which are respectively connected to the second data lines DL2, may be arranged on the second area AR2. In this case, the first pixels PX1 and the second pixels PX2 may be alternately arranged in the column direction (e.g., ±y direction).

The test circuit TC arranged in the peripheral area PA may further include a second voltage line VWL2, a plurality of third transistors T3, a plurality of fourth transistors T4, and a second gate line GWL2.

The second voltage line VWL2 may include a portion that is bent at least one time. For example, as illustrated in FIG. 4, the second voltage line VWL2 may include a first portion VWL2a and a second portion VWL2b that are spaced apart from each other in the column direction (e.g., ±y direction).

A first end portion e1' of the first portion VWL2a of the second voltage line VWL2 may be arranged to receive a second voltage V2, and a second end portion e2' of the first portion VWL2a of the second voltage line VWL2 may be connected to the second portion VWL2b of the second voltage line VWL2. During the test of the display panel 10, the first end portion e1' of the first portion VWL2a of the second voltage line VWL2 may receive the second voltage V2 and the second voltage V2 may be used to check whether the second pixels PX2 operate normally. On the other hand, while the display panel 10 is not tested, the first end portion e1' of the first portion VWL2a of the second voltage line VWL2 may not receive the second voltage V2.

In an embodiment, each of the first portion VWL2a of the second voltage line VWL2 and the second portion VWL2b of the second voltage line VWL2 may extend in the row direction (e.g., ±x direction).

The third transistors T3 may be respectively connected between the first connection nodes N1 and the first portion VWL2a of the second voltage line VWL2. The fourth transistors T4 may be respectively connected between the second connection nodes N2 and the second portion VWL2b of the second voltage line VWL2. Although FIG. 4 illustrates that the third transistors T3 and the fourth transistors T4 are p-type MOSFETs, the third transistors T3 and the fourth transistor T4 may alternatively be n-type MOSFETs.

The second gate line GWL2 may be commonly connected to the gates of the third transistors T3 and the gates of the fourth transistors T4. Like the first transistors T1 and the second transistors T2, the third transistors T3 and the fourth transistors T4 may be thin film is transistors for testing to check whether the second pixels PX2 of the display area DA operate normally in the process of manufacturing the display panel 10. During the test of the display panel 10, a plurality of second gate signals Sg2 for turning on the third transistors T3 and the fourth transistors T4 may be applied to the second gate line GWL2.

As described above with reference to FIG. 3A, the first gate line GWL1 may be commonly connected to the gates of the first transistors T1 and the gates of the second transistors T2, and a plurality of first gate signals Sg1 for turning on the first transistors T1 and the second transistors T2 may be applied to the first gate line GWL1 during the test of the display panel 10.

In an embodiment, the first gate signals Sg1 and the second gate signals Sg2 may be respectively alternately applied to the first gate line GWL1 and the second gate line GWL2. The first gate signals Sg1 and the second gate signals Sg2 may be alternately applied and thus the first voltage V1 and the second voltage V2 may be respectively applied to the first pixels PX1 and the second pixels PX2.

For example, the first pixels PX1 and the second pixels PX2 may be alternately arranged in the column direction (e.g., ±y direction). The first gate signals Sg1 capable of turning on the first transistors T1 and the second transistors T2 may be synchronized with the scan signals Sn (see FIG. 2) of the scan lines SL (see FIGS. 1 and 2) respectively connected to the first pixels PX1. The second gate signals Sg2 capable of turning on the third transistors T3 and the fourth transistors T4 may be synchronized with the scan signals Sn of the scan lines SL respectively connected to the second pixels PX2. Because the first pixels PX1 and the second pixels PX2 may be alternately arranged in the column direction (e.g., ±y direction), the scan lines SL respectively connected to the first pixels PX1 and the second pixels PX2 may also be alternately arranged. Thus, the first gate signals Sg1 and the second gate signals Sg1 respectively synchronized with the scan signals Sn of the scan lines SL respectively connected to the first pixels PX1 and the second pixels PX2 may be applied alternately with each other.

In an embodiment, the first data lines DL1 may be connected to the first voltage line VWL1 to be more adjacent to the first end portion e1 of the first portion VWL1a of the first voltage line VWL1 to which the first voltage V1 is applied, than the second data lines DL2. Also, the first data lines DL1 may be connected to the second voltage line VWL2 to be more adjacent to the first end portion e1' of the first portion VWL2a of the second voltage line VWL2 to which the second voltage V2 is applied, than the second data lines DL2.

The first data lines DL1 may be connected to the first portion VWL1a of the first voltage line VWL1 through the first connection lines CL1 and the first transistors T1, and the second data lines DL2 may be connected to the second portion VWL1b of the first voltage line VWL1 through the second transistors T2. During the test of the display panel 10, because the first voltage V1 is applied from the first end portion e1 of the first portion VWL1a of the first voltage line VWL1, the first data lines DL1 may be connected to the first voltage line VWL1 to be more adjacent to the first end portion e1 of the first portion VWL1a of the first voltage line VWL1 to which the first voltage V1 is applied, than the second data lines DL2.

The first data lines DL1 may be connected to the first portion VWL2a of the second voltage line VWL2 through the first connection lines CL1 and the third transistors T3, and the second data lines DL2 may be connected to the second portion VWL2b of the second voltage line VWL2 through the fourth transistors T4. During the test of the display panel 10, because the second voltage V2 is applied from the first end portion e1' of the first portion VWL2a of the second voltage line VWL2, the first data lines DL1 may be connected to the second voltage line VWL2 to be more adjacent to the first end portion e1' of the first portion VWL2a of the second voltage line VWL2 to which the second voltage V2 is applied, than the second data lines DL2.

As illustrated in FIG. 4, the first data lines DL1 may be arranged farther from the first voltage line VWL1 and the second voltage line VWL2 than the second data lines DL2. However, because the first data lines DL1 may be connected to the first voltage line VWL1 to be more adjacent to the first end portion e1 of the first portion VWL1a of the first voltage line VWL1 to which the first voltage V1 is applied, than the second data lines DL2, a voltage drop generated during the transmission of the first voltage V1 to the first data lines DL1 and a voltage drop generated during the transmission of the first voltage V1 to the second data lines DL2 may be similar to each other. Also, because the first data lines DL1 may be connected to the second voltage line VWL2 to be more adjacent to the first end portion e1' of the first portion VWL2a of the second voltage line VWL2 to which the second voltage V2 is applied, than the second data lines DL2, a voltage drop generated during the transmission of the second voltage V2 to the first data lines DL1 and a voltage drop generated during the transmission of the second voltage V2 to the second data lines DL2 may be similar to each other.

That is, the distance from the first portion VWL1a of the first voltage line VWL1 or the first portion VWL2a of the second voltage line VWL2 through the first connection lines CL1 to the first data lines DL1 may be similar to the distance from the second portion VWL1b of the first voltage line VWL1 or the second portion VWL2b of the second voltage line VWL2 to the second data lines DL2.

Although the first data lines DL1 and the second data lines DL2 have been compared with each other, the same may also be applied between the first data lines DL1. For example, the first data lines DL1 much spaced apart from the second area AR2 may be connected to the first voltage line VWL1 or the second voltage line VWL2 to be more adjacent to the first end portion e1 of the first portion VWL1a of the first voltage line VWL1 to which the first voltage V1 is applied or the first end portion e1' of the first portion VWL2a of the second voltage line VWL2 to which the second voltage V2 is applied, than the first data lines DL1 adjacent to the second area AR2.

As a comparative example, both the data lines adjacent to the edge of the display panel and the data lines located at the center of the display panel may be connected at the same portion as the voltage line of the test circuit. In this case, because data lines adjacent to the edge of the display panel are connected to the voltage line of the test circuit through the connection lines, the data lines may be more influenced by a voltage drop caused by the connection lines, than data lines located at the center of the display panel. Thus, the pixels connected to the data lines adjacent to the edge of the display panel may not emit light with a normal brightness by receiving a voltage different from a preset voltage. This phenomenon may appear more clearly when the display panel is driven at high speed.

As a result, a particular color other than a white color may be displayed in the display area. For example, red pixels may emit a red light brighter than a preset brightness and blue pixels may emit a blue light darker than a preset brightness and thus a substantially red color may be displayed in the display area. As such, during the test of the display panel, even when the pixels operate normally, a particular color may be displayed in the display area, and the display panel may be determined to be defective.

However, in an embodiment, the distance from the first portion VWL1a of the first voltage line VWL1 or the first portion VWL2a of the second voltage line VWL2 through the first connection lines CL1 to the first data lines DL1 may be similar to the distance from the second portion VWL1b of the first voltage line VWL1 or the second portion VWL2b of the second voltage line VWL2 to the second data lines DL2. In this case, because the influence of the voltage drop caused by the first connection lines CL1 may be offset, the first data lines DL1 may receive a preset voltage. Thus, a particular color display of the display area DA due to the voltage drop difference between the first data lines DL1 and the second data lines DL2 may be removed.

Figure 5:
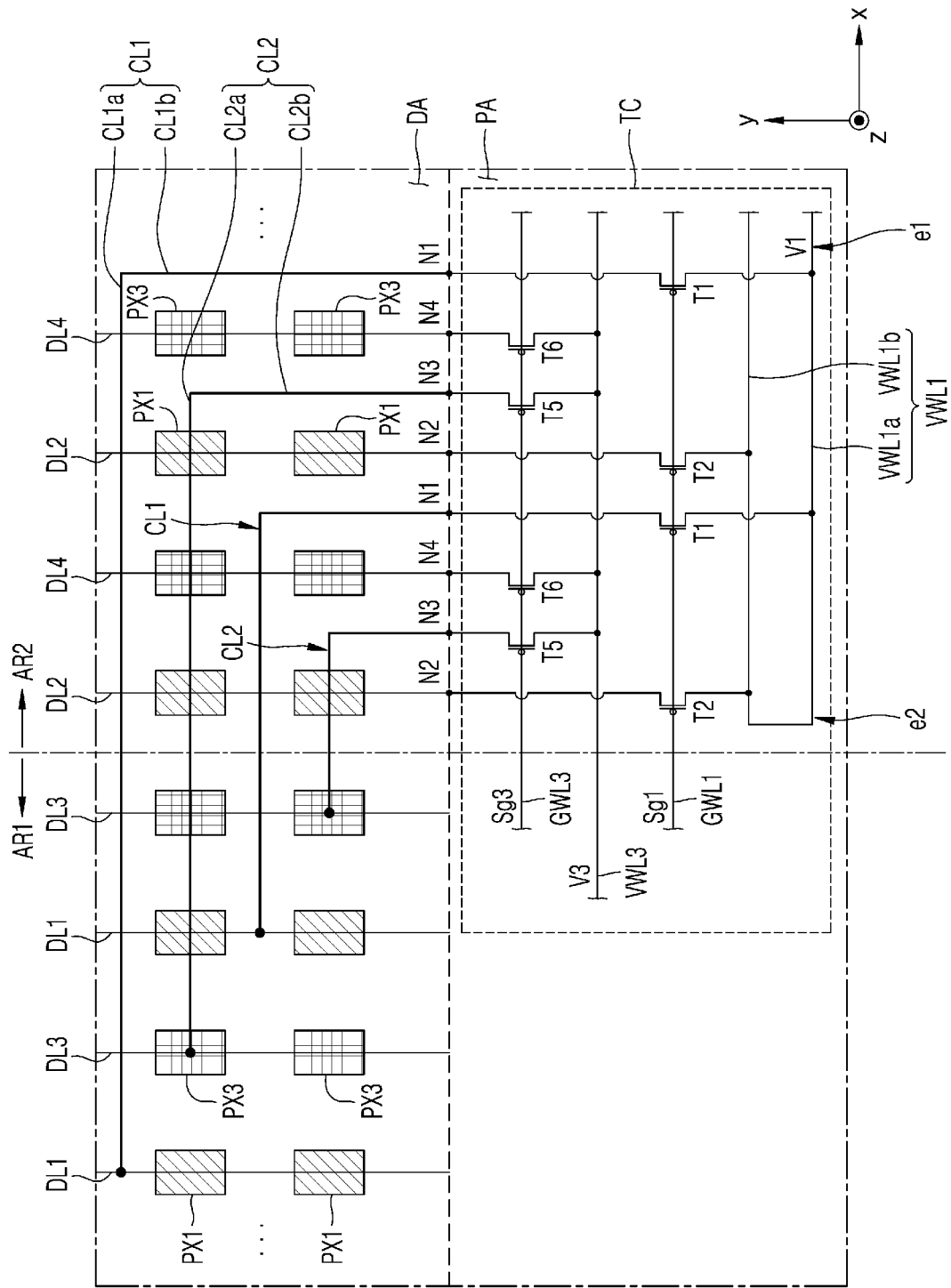
FIG. 5 is an enlarged plan view schematically illustrating a display panel according to other embodiments.

FIG. 5 is an enlarged plan view schematically illustrating a display panel according to other embodiments. FIG. 5 is a modification of FIG. 3A, redundant descriptions thereof with respect to those of FIG. 3A will be omitted for conciseness, and differences therebetween will be mainly described below.

Referring to FIG. 5, a plurality of first data lines DL1 and a plurality of third data lines DL3 extending in the column direction (e.g., ±y direction) may be arranged on the first area AR1. The first data lines DL1 and the third data lines DL3 may be alternately arranged in the row direction (e.g., ±x direction).

A plurality of first pixels PX1 and a plurality of third pixels PX3 may be arranged on the first area AR1. The first pixels PX1 may be respectively connected to the first data lines DL1 and may emit light of the first color. The third pixels PX3 may be respectively connected to the third data lines DL3 and may emit light of the third color. The first pixels PX1 and the third pixels PX3 may be alternately arranged in the row direction (e.g., ±x direction).

A plurality of second data lines DL2 and a plurality of fourth data lines DL4 extending in the column direction (e.g., ±y direction) may be arranged on the second area AR2. The second data lines DL2 and the fourth data lines DL4 may be alternately arranged in the row direction (e.g., ±x direction).

A plurality of first pixels PX1 and a plurality of third pixels PX3 may be arranged on the second area AR2. The first pixels PX1 may be respectively connected to the second data lines DL2 and may emit light of the first color. The third pixels PX3 may be respectively connected to the fourth data lines DL4 and may emit light of the third color. The first pixels PX1 and the third pixels PX3 may be alternately arranged in the row direction (e.g., ±x direction).

A plurality of third connection nodes N3 and a plurality of fourth connection nodes N4 may be arranged in the second area AR2. The third connection nodes N3 may be respectively connected to the third data lines DL3, and the fourth connection nodes N4 may be respectively connected to the fourth data lines DL4.

A plurality of second connection lines CL2 respectively connecting the third data lines DL3 to the third connection nodes N3 may be arranged on the first area AR1 and the second area AR2. The second connection lines CL2 may respectively correspond to the connection lines CL illustrated in FIG. 1 described above. Moreover, unlike the third data lines DL3, the fourth data lines DL4 and the fourth connection nodes N4 may be directly connected without separate connection lines.

Each of the second connection lines CL2 may include a first portion CL2a and a second portion CL2b. The first portion CL2a of each of the second connection lines CL2 may extend in the row direction (e.g., ±x direction), and the second portion CL2b of each of the second connection lines CL2 may extend in the column direction (e.g., ±y direction).

For example, the first portion CL2a of each of the second connection lines CL2 may extend in the row direction (e.g., ±x direction) from a corresponding third data line DL3 among the third data lines DL3. The second portion CL2*b* of each of the second connection lines CL2 may extend in the column direction (e.g., ±y direction) to a corresponding third connection node N3 among the third connection nodes N3.

In an embodiment, the length of the second connection line CL2 connected to the third data line DL3 may increase as the third data line DL3 is more spaced apart from the second area AR2. The length of the second connection line CL2 connected to the third data line DL3 may decrease as the third data line DL3 is more adjacent to the second area AR2. The distance of the third data line DL3 from the second area AR2 and the length of the second connection line CL2 connected to the third data line DL3 may be proportional to each other.

In other words, as the third data line DL3 is more spaced apart from the second area AR2, the third connection node N3 connected to the third data line DL3 may be more spaced apart from the first area AR1. As the third data line DL3 is more adjacent to the second area AR2, the third connection node N3 connected to the third data line DL3 may be more adjacent to the first area AR1. The distance of the third data line DL3 from the second area AR2 and the distance of the third connection node N3 connected to the third data line DL3 from the first area AR1 may be proportional to each other.

The test circuit TC arranged in the peripheral area PA may include a third voltage line VWL3, a plurality of fifth transistors T5, a plurality of sixth transistors T6, and a third gate line GWL3.

The third voltage line VWL3 may be arranged to receive a third voltage V3. During the test of the display panel 10, the third voltage line VWL3 may receive the third voltage V3, and the third voltage V3 may be used to check whether the third pixels PX3 operate normally. On the other hand, while the display panel 10 is not tested, the third voltage line VWL3 may not receive the third voltage V3. The third voltage line VWL3 may extend in the row direction (e.g., ±x direction). This is merely an embodiment and the shape of the third voltage line VWL3 may vary depending on the design.

The fifth transistors T5 may be respectively connected between the third connection nodes N3 and the third voltage line VWL3. The sixth transistors T6 may be respectively connected between the fourth connection nodes N4 and the third voltage line VWL3. Although FIG. 5 illustrates that the fifth transistors T5 and the sixth transistors T6 are p-type MOSFETs, the fifth transistors T5 and the sixth transistor T6 may be n-type MOSFETs.

The third gate line GWL3 may be commonly connected to the gates of the fifth transistors T5 and the gates of the sixth transistors T6. The fifth transistors T5 and the sixth transistors T6 may be thin film transistors for testing to check whether the third pixels PX3 of the display area DA operate normally in the process of manufacturing the display panel 10. During the test of the display panel 10, a plurality of third gate signals Sg3 for turning on the fifth transistors T5 and the sixth transistors T6 may be applied to the third gate line GWL3.

Figure 6:
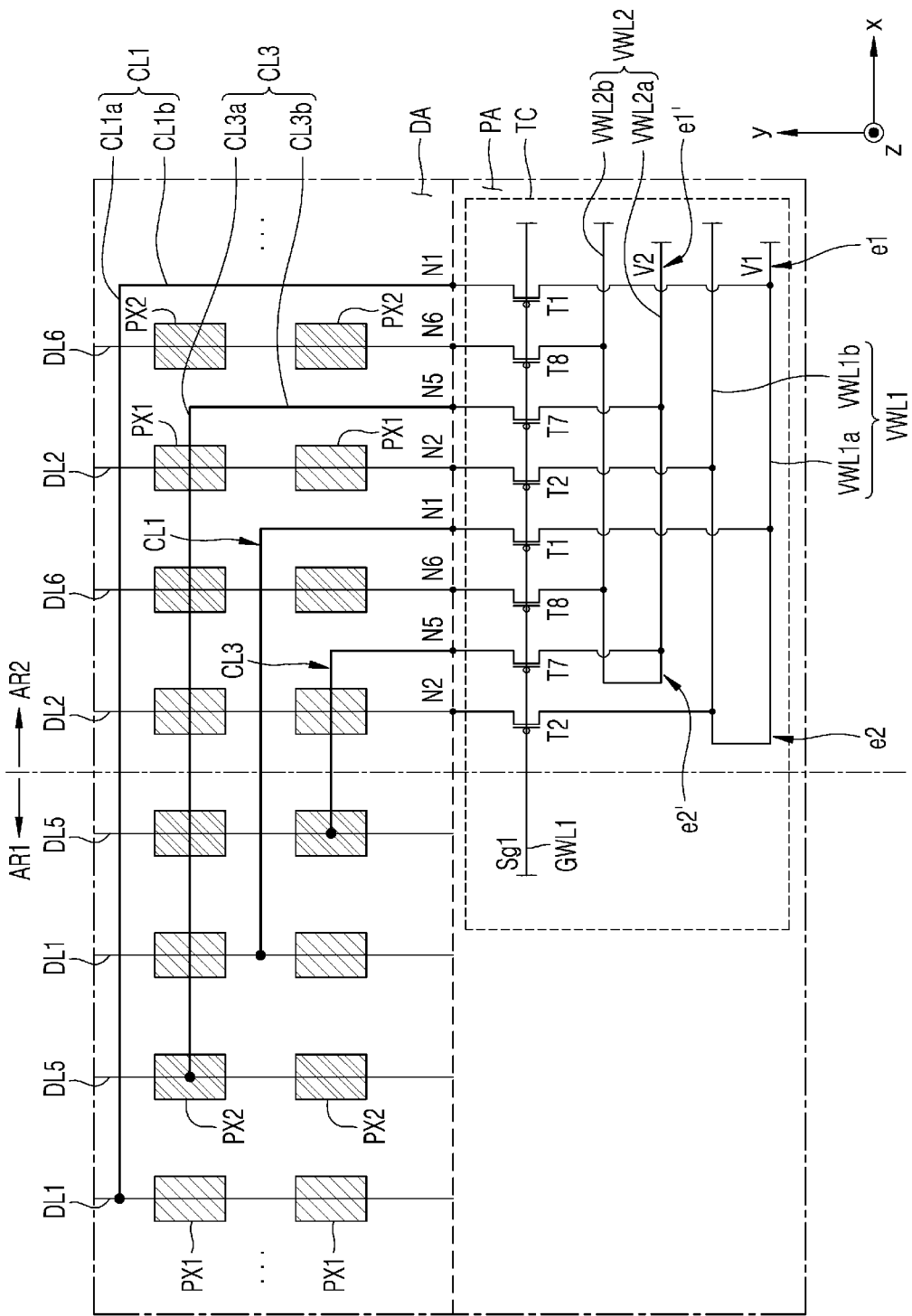
FIG. 6 is an enlarged plan view schematically illustrating a display panel according to other embodiments.

FIG. 6 is an enlarged plan view schematically illustrating a display panel according to other embodiments. FIG. 6 is a modification of FIG. 3A, redundant descriptions thereof with respect to those of FIG. 3A will be omitted for conciseness, and differences therebetween will be mainly described below.

Referring to FIG. 6, a plurality of first data lines DL1 and a plurality of fifth data lines DL5 extending in the column direction (e.g., ±y direction) may be arranged on the first area AR1. The first data lines DL1 and the fifth data lines DL5 may be alternately arranged in the row direction (e.g., ±x direction).

A plurality of first pixels PX1 and a plurality of second pixels PX2 may be arranged on the first area AR1. The first pixels PX1 may be respectively connected to the first data lines DL1 and may emit light of the first color. The second pixels PX2 may be respectively connected to the fifth data lines DL5 and may emit light of the second color. The first pixels PX1 and the second pixels PX2 may be alternately arranged in the row direction (e.g., ±x direction).

A plurality of second data lines DL2 and a plurality of sixth data lines DL6 extending in the column direction (e.g., ±y direction) may be arranged on the second area AR2. The second data lines DL2 and the sixth data lines DL6 may be alternately arranged in the row direction (e.g., ±x direction).

A plurality of first pixels PX1 and a plurality of second pixels PX2 may be arranged on the second area AR2. The first pixels PX1 may be respectively connected to the second data lines DL2 and may emit light of the first color. The second pixels PX2 may be respectively connected to the sixth data lines DL6 and may emit light of the second color. The first pixels PX1 and the second pixels PX2 may be alternately arranged in the row direction (e.g., ±x direction).

A plurality of fifth connection nodes N5 and a plurality of sixth connection nodes N6 may be arranged in the second area AR2. The fifth connection nodes N5 may be respectively connected to the fifth data lines DL5, and the sixth connection nodes N6 may be respectively connected to the sixth data lines DL6.

A plurality of third connection lines CL3 respectively connecting the fifth data lines DL5 to the fifth connection nodes N5 may be arranged on the first area AR1 and the second area AR2. The third connection lines CL3 may respectively correspond to the connection lines CL illustrated in FIG. 1 described above. Moreover, unlike the fifth data lines DL5, the sixth data lines DL6 and the sixth connection nodes N6 may be directly connected without separate connection lines.

Each of the third connection lines CL3 may include a first portion CL3*a* and a second portion CL3*b*. The first portion CL3*a* of each of the third connection lines CL3 may extend in the row direction (e.g., ±x direction), and the second portion CL3*b* of each of the third connection lines CL3 may extend in the column direction (e.g., ±y direction).

For example, the first portion CL3*a* of each of the third connection lines CL3 may extend in the row direction (e.g., ±x direction) from a corresponding fifth data line DL5 among the fifth data lines DL5. The second portion CL3*b* of each of the third connection lines CL3 may extend in the column direction (e.g., ±y direction) to a corresponding fifth connection node N5 among the fifth connection nodes N5.

In an embodiment, the length of the third connection line CL3 connected to the fifth data line DL5 may increase as the fifth data line DL5 is more spaced apart from the second area AR2. The length of the third connection line CL3 connected to the fifth data line DL5 may decrease as the fifth data line DL5 is more adjacent to the second area AR2. The distance of the fifth data line DL5 from the second area AR2 and the length of the third connection line CL3 connected to the fifth data line DL5 may be proportional to each other.

In other words, as the fifth data line DL5 is more spaced apart from the second area AR2, the fifth connection node N5 connected to the fifth data line DL5 may be more spaced apart from the first area AR1. As the fifth data line DL5 is more adjacent to the second area AR2, the fifth connection node N5 connected to the fifth data line DL5 may be more adjacent to the first area AR1. The distance of the fifth data line DL5 from the second area AR2 and the distance of the fifth connection node N5 connected to the fifth data line DL5 from the first area AR1 may be proportional to each other.

The test circuit TC arranged in the peripheral area PA may include a second voltage line VWL2, a plurality of seventh transistors T7, and a plurality of eighth transistors T8.

The second voltage line VWL2 may include a portion that is bent at least one time. For example, as illustrated in FIG. 4, the second voltage line VWL2 may include a first portion VWL2a and a second portion VWL2b that are spaced apart from each other in the column direction (e.g., ±y direction).

A first end portion e1' of the first portion VWL2a of the second voltage line VWL2 may be arranged to receive a second voltage V2, and a second end portion e2' of the first portion VWL2a of the second voltage line VWL2 may be connected to the second portion VWL2b of the second voltage line VWL2. The second voltage V2 received by the first end portion e1' of the first portion VWL2a of the second voltage line VWL2 may be used to check whether the second pixels PX2 operate normally. While the display panel 10 is not tested, the second voltage line VWL2 may not receive the second voltage V2.

In an embodiment, each of the first portion VWL2a of the second voltage line VWL2 and the second portion VWL2b of the second voltage line VWL2 may extend in the row direction (e.g., ±x direction).

The seventh transistors T7 may be respectively connected between the fifth connection nodes N5 and the first portion VWL2a of the second voltage line VWL2. The eighth transistors T8 may be respectively connected between the sixth connection nodes N6 and the second portion VWL2b of the second voltage line VWL2. Although FIG. 6 illustrates that the seventh transistors T7 and the eighth transistors T8 are p-type MOSFETs, the seventh transistors T7 and the eighth transistor T8 may be n-type MOSFETs.

The first gate line GWL1 may be commonly connected to the gates of the seventh transistors T7 and the gates of the eighth transistors T8. Like the first transistors T1 and the second transistors T2, the seventh transistors T7 and the eighth transistors T8 may be thin film is transistors for testing to check whether the second pixels PX2 of the display area DA operate normally in the process of manufacturing the display panel 10. During the test of the display panel 10, a plurality of first gate signals Sg1 for turning on the seventh transistors T7 and the eighth transistors T8 may be applied to the first gate line GWL1.

As such, the first gate line GWL1 may be commonly connected to the gates of the first transistors T1, the gates of the second transistors T2, the gates of the seventh transistors T7, and the gates of the eighth transistors T8. The first pixels PX1 and the second pixels PX2 may be alternately arranged in the row direction (e.g., ±x direction), and the first pixels PX1 and the second pixels PX2 arranged in the same row may share the scan line SL. Because the first pixels PX1 and the second pixels PX2 may share the scan line SL, the first transistors T1, the second transistors T2, the seventh transistors T7, and the eighth transistor T8 may be simultaneously turned on according to the first gate signals Sg1 synchronized with the scan signal Sn of the scan line SL.

In an embodiment, the fifth data lines DL5 may be connected to be more adjacent to the first end portion e1' of the first portion VWL2a of the second voltage line VWL2 to which the second voltage V2 is applied, than the sixth data lines DL6.

The fifth data lines DL5 may be connected to the first portion VWL2a of the second voltage line VWL2 through the third connection lines CL3 and the seventh transistors T7, and the sixth data lines DL6 may be connected to the second portion VWL2b of the second voltage line VWL2 through the eighth transistors T8. During the test of the display panel 10, because the second voltage V2 is applied from the first end portion e1' of the first portion VWL2a of the second voltage line VWL2, the fifth data lines DL5 may be connected to be more adjacent to the first end portion e1' of the first portion VWL2a of the second voltage line VWL2 to which the second voltage V2 is applied, than the sixth data lines DL6.

As illustrated in FIG. 6, the fifth data lines DL5 may be arranged farther from the second voltage line VWL2 than the sixth data lines DL6. However, because the fifth data lines DL5 may be connected to be more adjacent to the first end portion e1' of the first portion VWL2a of the second voltage line VWL2 to which the second voltage V2 is applied, than the sixth data lines DL6, a voltage drop generated during the transmission of the second voltage V2 to the fifth data lines DL5 and a voltage drop generated during the transmission of the second voltage V2 to the sixth data lines DL6 may be similar to each other.

That is, the distance from the first portion VWL2a of the second voltage line VWL2 through the third connection lines CL3 to the fifth data lines DL5 may be similar to the distance from the second portion VWL2b of the second voltage line VWL2 to the sixth data lines DL6.

Although the fifth data lines DL5 and the sixth data lines DL6 have been compared with each other, the same may also be applied between the fifth data lines DL5. For example, the fifth data lines DL5 much spaced apart from the second area AR2 may be connected to be more adjacent to the first end portion e1' of the first portion VWL2a of the second voltage line VWL2 to which the second voltage V2 is applied, than the fifth data lines DL5 adjacent to the second area AR2.

Figure 7:
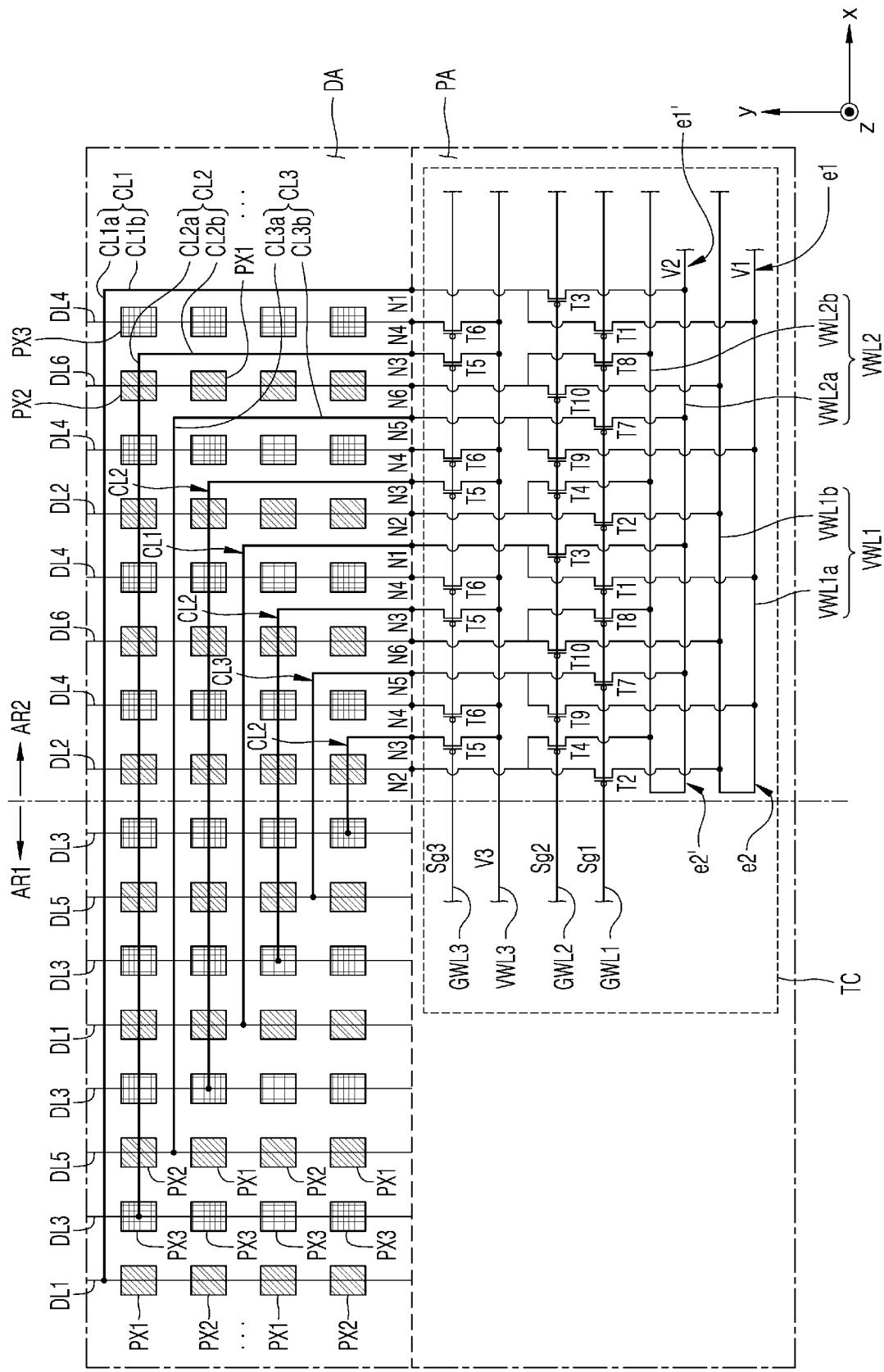
FIG. 7 is an enlarged plan view schematically illustrating a display panel according to other embodiments.

FIG. 7 is an enlarged plan view schematically illustrating a display panel according to other embodiments. FIG. 7 schematically illustrates a display panel including all of the configurations of FIGS. 3A and 4 to 6.

Referring to FIG. 7, a plurality of first data lines DL1, a plurality of third data lines DL3, and a plurality of fifth data lines DL5 extending in the column direction (e.g., ±y direction) may be arranged on the first area AR1. The third data lines DL3 may be respectively arranged between the first data lines DL1 and the fifth data lines DL5.

A plurality of first pixels PX1, a plurality of second pixels PX2, and a plurality of third pixels PX3 may be arranged on the first area AR1. The first pixels PX1 may be respectively connected to the first data lines DL1 and the fifth data lines DL5 and may emit light of the first color. The second pixels PX2 may be respectively connected to the first data lines DL1 and the fifth data lines DL5 and may emit light of the second color. The third pixels PX3 may be respectively connected to the third data lines DL3 and may emit light of the third color.

The first pixels PX1, the second pixels PX2, and the third pixels PX3 may be alternately arranged in the row direction (e.g., ±x direction). The first pixels PX1 and the second pixels PX2 may be respectively alternately arranged in the column direction (e.g., ±y direction) and/or the row direction (e.g., ±x direction).

A plurality of second data lines DL2, a plurality of fourth data lines DL4, and a plurality of sixth data lines DL6 extending in the column direction (e.g., ±y direction) may be arranged on the second area AR2. The fourth data lines DL4 may be respectively arranged between the second data lines DL2 and the sixth data lines DL6.

A plurality of first pixels PX1, a plurality of second pixels PX2, and a plurality of third pixels PX3 may be arranged on the second area AR2. The first pixels PX1 may be respectively connected to the second data lines DL2 and the sixth data lines DL6 and may emit light of the first color. The second pixels PX2 may be respectively connected to the second data lines DL2 and the sixth data lines DL6 and may emit light of the second color. The third pixels PX3 may be respectively connected to the fourth data lines DL4 and may emit light of the third color.

A plurality of first connection nodes N1, a plurality of second connection nodes N2, a plurality of third connection nodes N3, a plurality of fourth connection nodes N4, a plurality of fifth connection nodes N5, and a plurality of sixth connection nodes N6 may be arranged in the second area AR2. The first connection nodes N1 may be respectively connected to the first data lines DL1, the second connection nodes N2 may be respectively connected to the second data lines DL2, the third connection nodes N3 may be respectively connected to the third data lines DL3, the fourth connection nodes N4 may be respectively connected to the fourth data lines DL4, the fifth connection nodes N5 may be respectively connected to the fifth data lines DL5, and the sixth connection nodes N6 may be respectively connected to the sixth data lines DL6.

A plurality of first connection lines CL1, a plurality of second connection lines CL2, and a plurality of third connection lines CL3 may be arranged on the first area AR1 and the second area AR2. The first connection lines CL1, the second connection lines CL2, and the third connection line CL3 may respectively correspond to the connection lines CL illustrated in FIG. 1 described above.

The first connection lines CL1 may respectively connect the first data lines DL1 to the first connection nodes N1, the second connection lines CL2 may respectively connect the third data lines DL3 to the third connection nodes N3, and the third connection lines CL3 may respectively connect the fifth data lines DL5 to the fifth connection nodes N5.

The first connection lines CL1, the second connection lines CL2, and the third connection lines CL3 may respectively include first portions CL1a, CL2a, and CL3a and second portions CL1b, CL2b, and CL3b. This has already been described above with reference to FIGS. 3A and 4 to 6.

The test circuit TC arranged in the peripheral area PA may include a first voltage line VWL1, a second voltage line VWL2, a third voltage line VWL3, a plurality of first transistors T1, a plurality of second transistors T2, a plurality of third transistors T3, a plurality of fourth transistors T4, a plurality of fifth transistors T5, a plurality of sixth transistors T6, a plurality of seventh transistors T7, a plurality of eighth transistors T8, a plurality of ninth transistors T9, a plurality of tenth transistors T10, a first gate line GWL1, a second gate line GWL2, and a third gate line GWL3. The descriptions of the respective components will be replaced with the descriptions of FIGS. 3A and 4 to 6, and the connection relationship between the respective components in the test circuit TC will be described below.

The first transistors T1 may be respectively connected between the first connection nodes N1 and the first portion VWL1a of the first voltage line VWL1, and the second transistors T2 may be respectively connected between the second connection nodes N2 and the second portion VWL1b of the first voltage line VWL1. The gates of the first transistors T1 and the gates of the second transistors T2 may be commonly connected to the first gate line GWL1.

The third transistors T3 may be respectively connected between the first connection nodes N1 and the first portion VWL2a of the second voltage line VWL2, and the fourth transistors T4 may be respectively connected between the second connection nodes N2 and the second portion VWL2b of the second voltage line VWL2. The gates of the third transistors T3 and the gates of the fourth transistors T4 may be commonly connected to the second gate line GWL2.

The fifth transistors T5 may be respectively connected between the third connection nodes N3 and the third voltage line VWL3, and the sixth transistors T6 may be respectively connected between the fourth connection nodes N4 and the third voltage line VWL3. The gates of the fifth transistors T5 and the gates of the sixth transistors T6 may be commonly connected to the third gate line GWL3.

The seventh transistors T7 may be respectively connected between the fifth connection nodes N5 and the first portion VWL2a of the second voltage line VWL2, and the eighth transistors T8 may be respectively connected between the sixth connection nodes N6 and the second portion VWL2b of the second voltage line VWL2. The gates of the seventh transistors T7 and the gates of the eighth transistors T8 may be commonly connected to the first gate line GWL1.

The ninth transistors T9 may be respectively connected between the fifth connection nodes N5 and the first portion VWL1a of the first voltage line VWL1, and the tenth transistors T10 may be respectively connected between the sixth connection nodes N6 and the second portion VWL1b of the first voltage line VWL1. The gates of the ninth transistors T9 and the gates of the tenth transistors T10 may be commonly connected to the second gate line GWL2. Although FIG. 7 illustrates that the ninth transistors T9 and the tenth transistors T10 are p-type MOSFETs, the ninth transistors T9 and the tenth transistor T10 may be n-type MOSFETs.

Hereinafter, a test process of the display panel 10 according to an embodiment will be described in detail. As illustrated in FIG. 7, it is assumed that the first to tenth transistors T1 to T10 are p-type MOSFETs.

First, when the low-level first gate signals Sg1 are applied to the first gate line GWL1, the first transistors T1, the second transistors T2, the seventh transistors T7, and the eight transistors T8 may be turned on.

As the first transistors T1 are turned on, the first voltage V1 may be applied to each of the first data lines DL1 through the first connection lines CL1, and as the second transistors T2 are turned on, the first voltage V1 may be applied to each of the second data lines DL2. In this case, when the first pixels PX1 respectively connected to the first data lines DL1 and the second data lines DL2 operate normally, the first pixels PX1 may emit light with a brightness corresponding to the first voltage V1.

In an embodiment, the first data lines DL1 may be connected to the first voltage line VWL1 to be more adjacent to the first end portion e1 of the first portion VWL1a of the first voltage line VWL1 to which the first voltage V1 is applied, than the second data lines DL2. Thus, the difference between the load from the first voltage line VWL1 to the first data lines DL1 and the load from the first voltage line VWL1 to the second data lines DL2 may be reduced.

As the seventh transistors T7 are turned on, the second voltage V2 may be applied to each of the fifth data lines DL5 through the third connection lines CL3, and as the eighth transistors T8 are turned on, the second voltage V2 may be applied to each of the sixth data lines DL6. In this case, when the second pixels PX2 respectively connected to the fifth data lines DL5 and the sixth data lines DL6 operate normally, the second pixels PX2 may emit light with a brightness corresponding to the second voltage V2.

In an embodiment, the fifth data lines DL5 may be connected to the second voltage line VWL2 to be more adjacent to the first end portion e1' of the first portion VWL2a of the second voltage line VWL2 to which the second voltage V2 is applied, than the sixth data lines DL6. Thus, the difference between the load from the second voltage line VWL2 to the fifth data lines DL5 and the load from the second voltage line VWL2 to the sixth data lines DL6 may be reduced.

Thereafter, when the low-level second gate signals Sg2 are applied to the second gate line GWL2, the third transistors T3, the fourth transistors T4, the ninth transistors T9, and the tenth transistors T10 may be turned on.

As the third transistors T3 are turned on, the second voltage V2 may be applied to each of the first data lines DL1 through the first connection lines CL1, and as the fourth transistors T4 are turned on, the second voltage V2 may be applied to each of the second data lines DL2. In this case, when the second pixels PX2 respectively connected to the first data lines DL1 and the second data lines DL2 operate normally, the second pixels PX2 may emit light with a brightness corresponding to the second voltage V2.

In an embodiment, the first data lines DL1 may be connected to the second voltage line VWL2 to be more adjacent to the first end portion e1' of the first portion VWL2a of the second voltage line VWL2 to which the second voltage V2 is applied, than the second data lines DL2. Thus, the difference between the load from the second voltage line VWL2 to the first data lines DL1 and the load from the second voltage line VWL2 to the second data lines DL2 may be reduced.

As the ninth transistors T9 are turned on, the first voltage V1 may be applied to each of the fifth data lines DL5 through the third connection lines CL3, and as the tenth transistors T10 are turned on, the first voltage V1 may be applied to each of the sixth data lines DL6. In this case, when the first pixels PX1 respectively connected to the fifth data lines DL5 and the sixth data lines DL6 operate normally, the first pixels PX1 may emit light with a brightness corresponding to the first voltage V1.

In an embodiment, the fifth data lines DL5 may be connected to the first voltage line VWL1 to be more adjacent to the first end portion e1 of the first portion VWL1a of the first voltage line VWL1 to which the first voltage V1 is applied, than the sixth data lines DL6. Thus, the difference between the load from the first voltage line VWL1 to the fifth data lines DL5 and the load from the first voltage line VWL1 to the sixth data lines DL6 may be reduced.

In an embodiment, the low-level first gate signals Sg1 and the low-level second gate signals Sg2 may be respectively alternately applied to the first gate line GWL1 and the second gate line GWL2. In this case, the first voltage V1 and the second voltage V2 may be respectively applied to the first pixels PX1 and the second pixels PX2 respectively alternately arranged in the column direction (e.g., ±y direction) and/or the row direction (e.g., ±x direction), and it may be checked whether each of the first pixels PX1 and the second pixels PX2 is defective.

Moreover, while the low-level first gate signals Sg1 and the low-level second gate signals Sg2 are respectively alternately applied to the first gate line GWL1 and the second gate line GWL2, the low-level third gate signal Sg3 may be applied to the gate line GWL3.

When the low-level third gate signals Sg3 are applied to the third gate line GWL3, the fifth transistors T5 and the sixth transistors T6 may be turned on.

As the fifth transistors T5 are turned on, the third voltage V3 may be applied to each of the third data lines DL3 through the second connection lines CL2, and as the sixth transistors T6 are turned on, the third voltage V3 may be applied to each of the fourth data lines DL4. In this case, when the third pixels PX3 respectively connected to the third data lines DL3 and the fourth data lines DL4 operate normally, the third pixels PX3 may emit light with a brightness corresponding to the third voltage V3.

Figure 8:
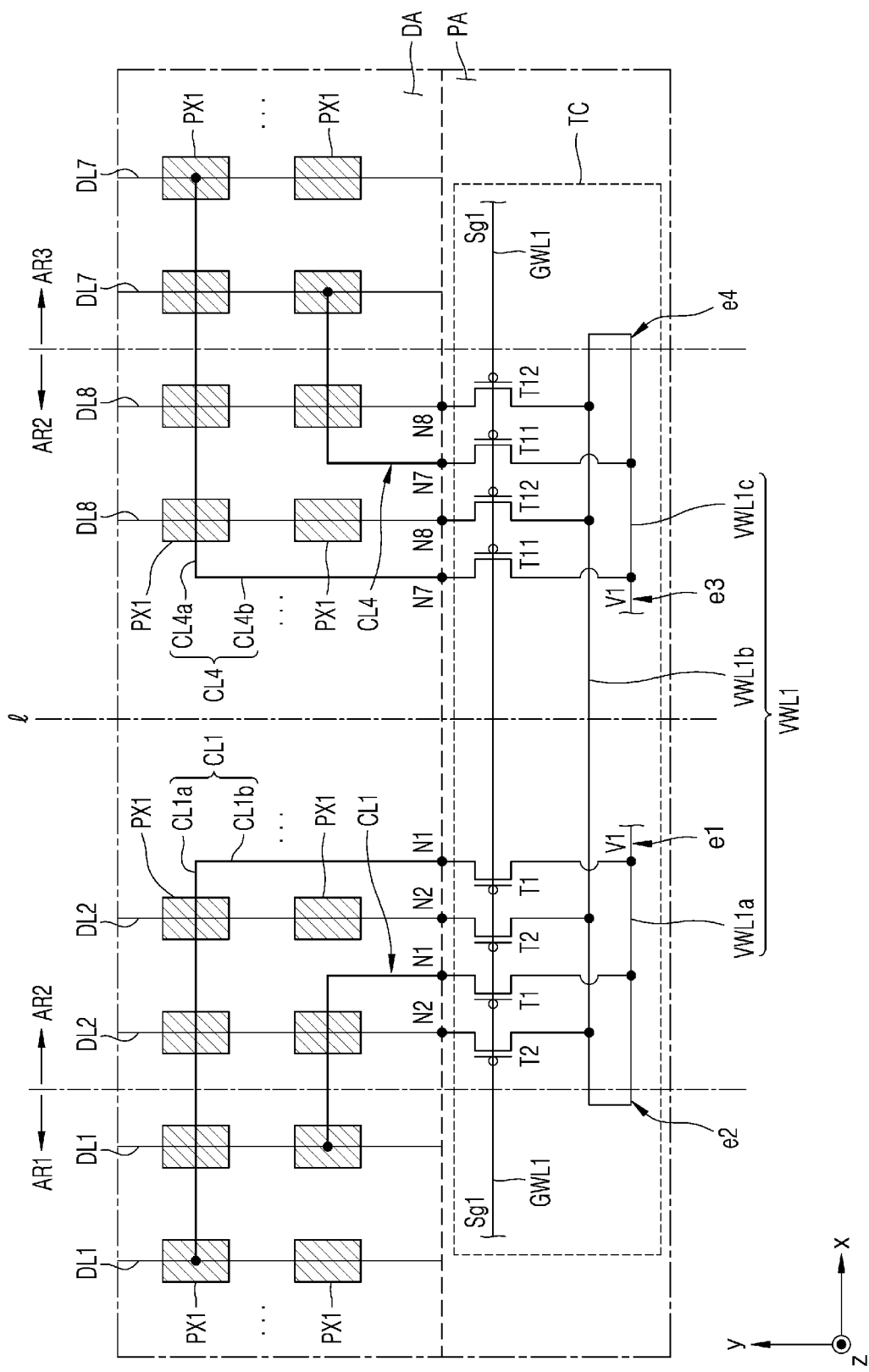
FIG. 8 is an enlarged plan view schematically illustrating a display panel according to other embodiments.

FIG. 8 is an enlarged plan view schematically illustrating a display panel according to other embodiments. Particularly, FIG. 8 is an enlarged view of a portion of the first area AR1, a portion of the second area AR2, a portion of the third area AR3, and the test circuit TC of the display panel 10 of FIG. 1. FIG. 8 is a modification of FIG. 3A, redundant descriptions thereof with respect to those of FIG. 3A will be omitted for conciseness, and differences therebetween will be mainly described below.

As described above with reference to FIG. 1, the first area AR1 and a portion of the second area AR2 located on the left side of a virtual line l passing through approximately the center of the display panel 10 in the row direction (e.g., ±x direction), and another portion of the second area AR2 and the third area AR3 located on the right side of the virtual line l may be approximately horizontally symmetrical with respect to the virtual line l.

That is, as illustrated in FIG. 8, the configurations of the first area AR1 and the second area AR2 may be symmetrical to the configurations of the third area AR3 and the second area AR2. The configurations of the first area AR1 and the second area AR2 may be the same as those described above with reference to FIG. 3A, and the configurations of the third area AR3 and the second area AR2 will be described below with reference to FIG. 8.

Referring to FIG. 8, the display panel 10 may include a third area AR3 and a second area AR2. Each of the third area AR3 and the second area AR2 may overlap at least a portion of the display area DA and may overlap at least a portion of the peripheral area PA.

A plurality of seventh data lines DL7 extending in the column direction (e.g., ±y direction) may be arranged on the third area AR3. A plurality of first pixels PX1 respectively connected to the seventh data lines DL7 and emitting light of the first color may be arranged on the third area AR3. The seventh data lines DL7 may respectively correspond to the first data lines DL1.

A plurality of eighth data lines DL8 extending in the column direction (e.g., ±y direction) may be arranged on the second area AR2. A plurality of first pixels PX1 respectively connected to the eighth data lines DL8 and emitting light of the first color may be arranged on the second area AR2. The eighth data lines DL8 may respectively correspond to the second data lines DL2.

A plurality of seventh connection nodes N7 and a plurality of eighth connection nodes N8 may be arranged in the second area AR2. The seventh connection nodes N7 may be respectively connected to the seventh data lines DL7, and the eighth connection nodes N8 may be respectively connected to the eighth data lines DL8. The seventh connection nodes N7 may respectively correspond to the first connection nodes N1, and the eighth connection nodes N8 may respectively correspond to the second connection nodes N2.

A plurality of fourth connection lines CL4 respectively connecting the seventh data lines DL7 to the seventh connection nodes N7 may be arranged on the third area AR3 and the second area AR2. The fourth connection lines CL4 may respectively correspond to the connection lines CL illustrated in FIG. 1 described above. Moreover, unlike the seventh data lines DL7, the eighth data lines DL8 and the eighth connection nodes N8 may be directly connected without separate connection lines.

Each of the fourth connection lines CL4 may include a first portion CL4a and a second portion CL4b. The first portion CL4a of each of the fourth connection lines CL4 may extend in the row direction (e.g., ±x direction), and the second portion CL4b of each of the fourth connection lines CL4 may extend in the column direction (e.g., ±y direction).

For example, the first portion CL4a of each of the fourth connection lines CL4 may extend in the row direction (e.g., ±x direction) from a corresponding seventh data line DL7 among the seventh data lines DL7. The second portion CL4b of each of the fourth connection lines CL4 may extend in the column direction (e.g., ±y direction) to a corresponding seventh connection node N7 among the seventh connection nodes N7.

In an embodiment, the length of the fourth connection line CL4 connected to the seventh data line DL7 may increase as the seventh data line DL7 is more spaced apart from the second area AR2. The length of the fourth connection line CL4 connected to the seventh data line DL7 may decrease as the seventh data line DL7 is more adjacent to the second area AR2. The distance of the seventh data line DL7 from the second area AR2 and the length of the fourth connection line CL4 connected to the seventh data line DL7 may be proportional to each other.

In other words, as the seventh data line DL7 is more spaced apart from the second area AR2, the seventh connection node N7 connected to the seventh data line DL7 may be more spaced apart from the third area AR3. As the seventh data line DL7 is more adjacent to the second area AR2, the seventh connection node N7 connected to the seventh data line DL7 may be more adjacent to the third area AR3. The distance of the seventh data line DL7 from the second area AR2 and the distance of the seventh connection node N7 connected to the seventh data line DL7 from the third area AR3 may be proportional to each other.

The test circuit TC arranged in the peripheral area PA may include a first voltage line VWL1, a plurality of eleventh transistors T11, a plurality of twelfth transistors T12, and a first gate line GWL1.

The first voltage line VWL1 may include a portion that is bent at least one time. For example, as illustrated in FIG. 8, the first voltage line VWL1 may include a first portion VWL1a, a second portion VWL1b spaced apart from the first portion VWL1a in the column direction (e.g., ±y direction), and a third portion VWL1c spaced apart from the second portion VWL1b in the column direction (e.g., ±y direction).

Each of a first end portion e1 of the first portion VWL1a of the first voltage line VWL1 and a third end portion e3 of the third portion VWL1c of the first voltage line VWL1 may is be arranged to receive the first voltage V1. Each of a second end portion e2 of the first portion VWL1a of the first voltage line VWL1 and a fourth end portion e4 of the third portion VWL1c of the first voltage line VWL1 may be connected to the second portion VWL1b of the first voltage line VWL1.

The first voltage V1 received by each of the first end portion e1 of the first portion VWL1a of the first voltage line VWL1 and the third end portion e3 of the third portion VWL1c of the first voltage line VWL1 may be used to check whether the first pixels PX1 operate normally. While the display panel 10 is not tested, the third end portion e3 of the third portion VWL1c of the first voltage line VWL1 may not receive the first voltage V1.

In an embodiment, each of the first portion VWL1a of the first voltage line VWL1, the second portion VWL1b of the first voltage line VWL1, and the third portion VWL1c of the first voltage line VWL1 may extend in the row direction (e.g., ±x direction).

The eleventh transistors T11 may be respectively connected between the seventh connection nodes N7 and the third portion VWL1c of the first voltage line VWL1. The twelfth transistors T12 may be respectively connected between the eighth connection nodes N8 and the second portion VWL1b of the first voltage line VWL1. Although FIG. 8 illustrates that the eleventh transistors T11 and the twelfth transistors T12 are p-type MOSFETs, the eleventh transistors T11 and the twelfth transistor T12 may be n-type MOSFETs.

The first gate line GWL1 may be commonly connected to the gates of the eleventh transistors T11 and the gates of the twelfth transistors T12. Like the first transistors T1 and the second transistors T2, the eleventh transistors T11 and the twelfth transistors T12 may be thin film transistors for testing to check whether the first pixels PX1 of the display area DA operate normally in the process of manufacturing the display panel 10. During the test of the display panel 10, a plurality of first gate signals Sg1 for turning on the eleventh transistors T11 and the twelfth transistors T12 may be applied to the first gate line GWL1.

As such, the first gate line GWL1 may be commonly connected to the gates of the first transistors T1, the gates of the second transistors T2, the gates of the eleventh transistors T11, and the gates of the twelfth transistors T12. Thus, the first transistors T1, the second transistors T2, the eleventh transistors T11, and the twelfth transistor T12 may be simultaneously turned on according to the first gate signals Sg1.

Figure 9A:
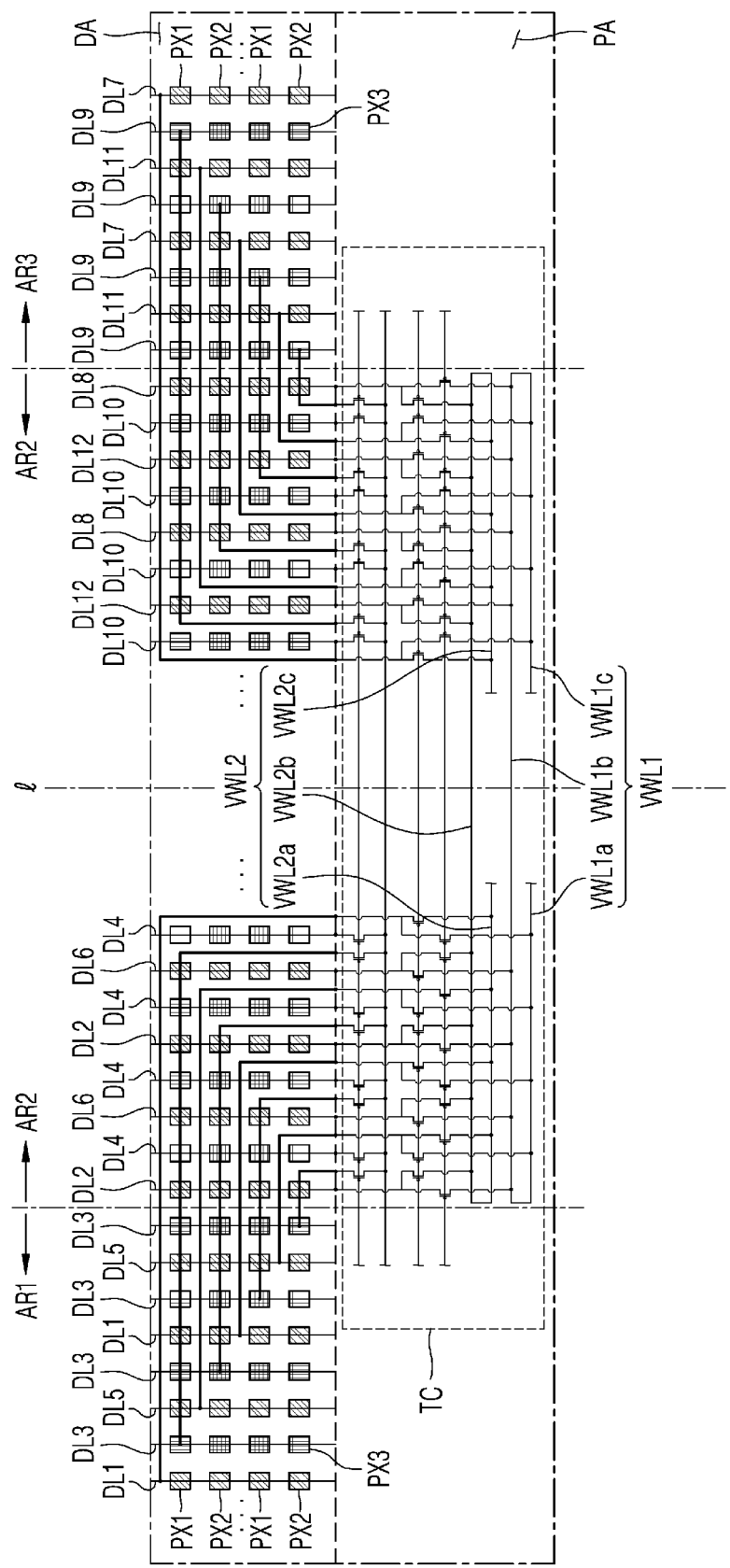
FIG. 9A is an enlarged plan view schematically illustrating a display panel according to other embodiments.
Figure 9B:
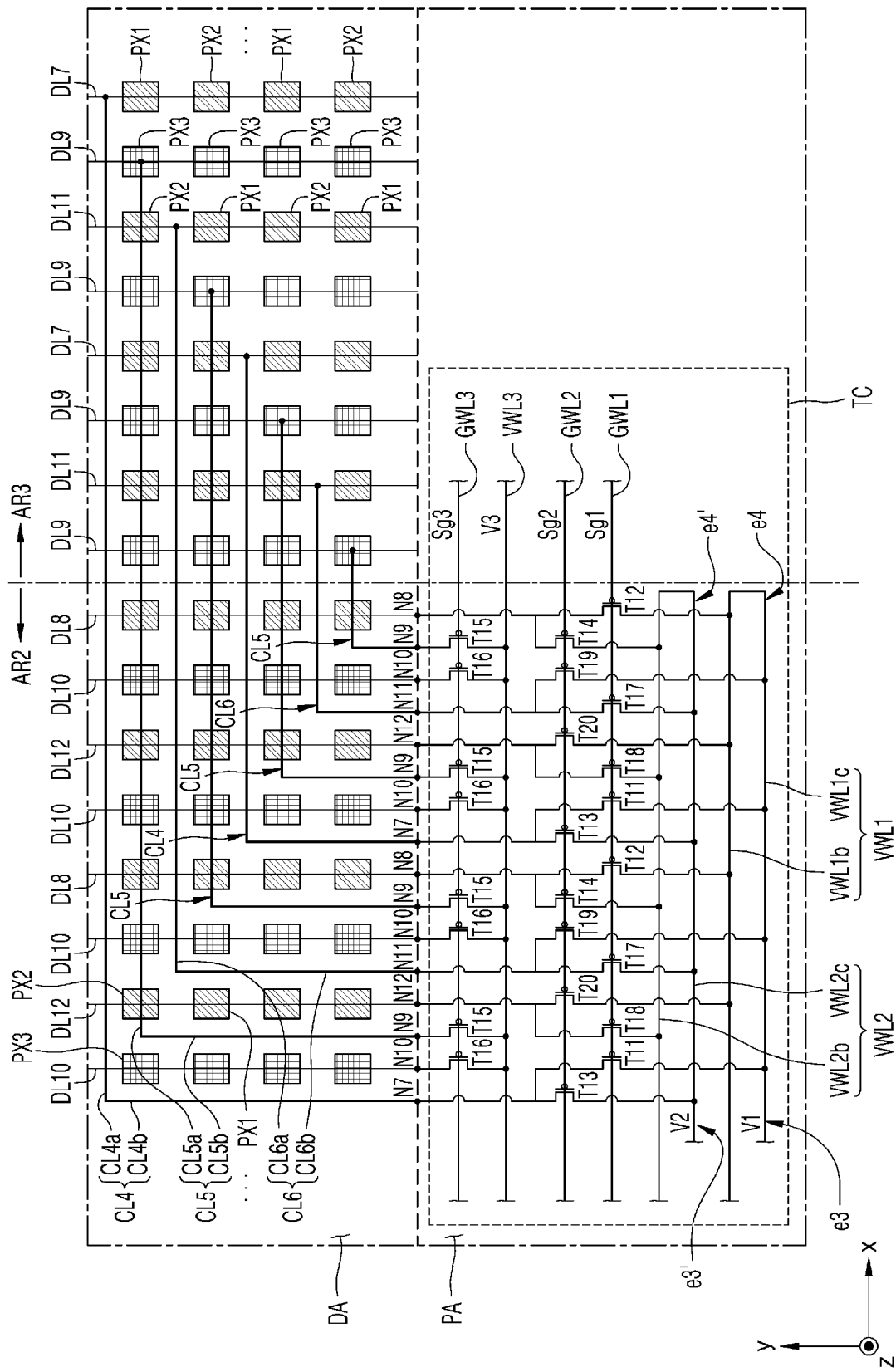
FIG. 9B is an enlarged plan view schematically illustrating a portion of FIG. 9A.

FIG. 9A is an enlarged plan view schematically illustrating a display panel according to other embodiments. FIG. 9B is an enlarged plan view schematically illustrating a portion of FIG. 9A. FIGS. 9A and 9B are a modification of FIGS. 7 and 8, redundant descriptions thereof with respect to those of FIGS. 7 and 8 will be omitted for conciseness, and differences therebetween will be mainly described below As described above with reference to FIG. 1, the first area AR1 and a portion of the second area AR2 located on the left side of a virtual line l passing through approximately the center of the display panel 10 in the row direction (e.g., ±x direction), and another portion of the second area AR2 and the third area AR3 located on the right side of the virtual line l may be approximately horizontally symmetrical with respect to the virtual line l.

That is, as illustrated in FIG. 9A, the configurations of the first area AR1 and the second area AR2 may be symmetrical to the configurations of the third area AR3 and the second area AR2. The configurations of the first area AR1 and the second area AR2 may be the same as those described above with reference to FIG. 7, and the configurations of the third area AR3 and the second area AR2 will be described below with reference to FIGS. 9A and 9B.

Referring to FIGS. 9A and 9B, a plurality of seventh data lines DL7, a plurality of ninth data lines DL9, and a plurality of eleventh data lines DL11 extending in the column direction (e.g., ±y direction) may be arranged on the third area AR3. The ninth data lines DL9 may be respectively arranged between the seventh data lines DL7 and the eleventh data lines DL11.

The seventh data lines DL7 may respectively correspond to the first data lines DL1, the ninth data lines DL9 may respectively correspond to the third data lines DL3, and the eleventh data lines DL11 may respectively correspond to the fifth data lines DL5.

A plurality of eighth data lines DL8, a plurality of tenth data lines DL10, and a plurality of twelfth data lines DL12 extending in the column direction (e.g., ±y direction) may be arranged on the second area AR2. The tenth data lines DL10 may be respectively arranged between the eighth data lines DL8 and the twelfth data lines DL12.

The eighth data lines DL8 may respectively correspond to the second data lines DL2, the tenth data lines DL10 may respectively correspond to the fourth data lines DL4, and the twelfth data lines DL12 may respectively correspond to the sixth data lines DL6.

A plurality of seventh connection nodes N7, a plurality of eighth connection nodes N8, a plurality of ninth connection nodes N9, a plurality of tenth connection nodes N10, a plurality of eleventh connection nodes N11, and a plurality of twelfth connection nodes N12 may be arranged in the second area AR2. The seventh connection nodes N7 may be respectively connected to the seventh data lines DL7, the eighth connection nodes N8 may be respectively connected to the eighth data lines DL8, the ninth connection nodes N9 may be respectively connected to the ninth data lines DL9, the tenth connection nodes N10 may be respectively connected to the tenth data lines DL10, the eleventh connection nodes N11 may be respectively connected to the eleventh data lines DL11, and the twelfth connection nodes N12 may be respectively connected to the twelfth data lines DL12.

The seventh connection nodes N7 may respectively correspond to the first connection nodes N1, the eighth connection nodes N8 may respectively correspond to the second connection nodes N2, the ninth connection nodes N9 may respectively correspond to the third connection nodes N3, the tenth connection nodes N10 may respectively correspond to the fourth connection nodes N4, the eleventh connection nodes N11 may respectively correspond to the fifth connection nodes N5, and the twelfth connection nodes N12 may respectively correspond to the sixth connection nodes N6.

A plurality of fourth connection lines CL4, a plurality of fifth connection lines CL5, and a plurality of sixth connection lines CL6 may be arranged on the third area AR3 and the second area AR2. The fourth connection lines CL4, the fifth connection lines CL5, and the sixth connection lines CL6 may respectively correspond to the connection lines CL illustrated in FIG. 1 described above.

The fourth connection lines CL4 may respectively connect the seventh data lines DL7 to the seventh connection nodes N7, the fifth connection lines CL5 may respectively connect the ninth data lines DL9 to the ninth connection nodes N9, and the sixth connection lines CL6 may respectively connect the eleventh data lines DL11 to the eleventh connection nodes N11.

Each of the fourth connection lines CL4 may include a first portion CL4a and a second portion CL4b. The first portion CL4a of each of the fourth connection lines CL4 may extend in the row direction (e.g., ±x direction), and the second portion CL4b of each of the fourth connection lines CL4 may extend in the column direction (e.g., ±y direction).

For example, the first portion CL4a of each of the fourth connection lines CL4 may extend in the row direction (e.g., ±x direction) from a corresponding seventh data line DL7 among the seventh data lines DL7. The second portion CL4b of each of the fourth connection lines CL4 may extend in the column direction (e.g., ±y direction) to a corresponding seventh connection node N7 among the seventh connection nodes N7.

In an embodiment, the length of the fourth connection line CL4 connected to the seventh data line DL7 may increase as the seventh data line DL7 is more spaced apart from the second area AR2. The length of the fourth connection line CL4 connected to the seventh data line DL7 may decrease as the seventh data line DL7 is more adjacent to the second area AR2. The distance of the seventh data line DL7 from the second area AR2 and the length of the fourth connection line CL4 connected to the seventh data line DL7 may be proportional to each other.

In other words, as the seventh data line DL7 is more spaced apart from the second area AR2, the seventh connection node N7 connected to the seventh data line DL7 may be more spaced apart from the third area AR3. As the seventh data line DL7 is more adjacent to the second area AR2, the seventh connection node N7 connected to the seventh data line DL7 may be more adjacent to the third area AR3. The distance of the seventh data line DL7 from the second area AR2 and the distance of the seventh connection node N7 connected to the seventh data line DL7 from the third area AR3 may be proportional to each other.

Although the description has been given based on the fourth connection lines CL4, the fifth connection lines CL5 and the sixth connection line CL6 may also be applied in the same manner. That is, the fifth connection lines CL5 and the sixth connection lines CL6 may respectively include first portions CL5a and CL6a and second portions CL5b and CL6b.

The test circuit TC arranged in the peripheral area PA may include a first voltage line VWL1, a second voltage line VWL2, a third voltage line VWL3, a plurality of first to tenth transistors T1 to T10, a plurality of eleventh to twentieth transistors T11 to T20, a first gate line GWL1, a second gate line GWL2, and a third gate line GWL3. The plurality of eleventh to twentieth transistors T11 to T20 may respectively correspond to the plurality of first to tenth transistors T1 to T10.

The first voltage line VWL1 may include a portion that is bent at least one time. For example, as illustrated in FIGS. 9A and 9B, the first voltage line VWL1 may include a first portion VWL1a, a second portion VWL1b spaced apart from the first portion VWL1a in the column direction (e.g., ±y direction), and a third portion VWL1c spaced apart from the second portion VWL1b in the column direction (e.g., ±y direction).

Each of a first end portion e1 of the first portion VWL1a of the first voltage line VWL1 and a third end portion e3 of the third portion VWL1c of the first voltage line VWL1 may be arranged to receive the first voltage V1. Each of a second end portion e2 of the first portion VWL1a of the first voltage line VWL1 and a fourth end portion e4 of the third portion VWL1c of the first voltage line VWL1 may be connected to the second portion VWL1b of the first voltage line VWL1.

The first voltage V1 received by each of the first end portion e1 of the first portion VWL1a of the first voltage line VWL1 and the third end portion e3 of the third portion VWL1c of the first voltage line VWL1 may be used to check whether the first pixels PX1 operate normally. While the display panel 10 is not tested, a first end portion e1 of the first portion VWL1a of the first voltage line VWL1 and a third end portion e3 of the third portion VWL1c of the first voltage line VWL1 may not receive the first voltage V1.

The second voltage line VWL2 may include a portion that is bent at least one time. For example, as illustrated in FIGS. 9A and 9B, the second voltage line VWL2 may include a first portion VWL2a, a second portion VWL2b spaced apart from the first portion VWL2a in the column direction (e.g., ±y direction), and a third portion VWL2c spaced apart from the second portion VWL2b in the column direction (e.g., ±y direction).

Each of a first end portion e1' of the first portion VWL2a of the second voltage line VWL2 and a third end portion e3' of the third portion VWL2c of the second voltage line VWL2 may be arranged to receive the second voltage V2. Each of a second end portion e2' of the first portion VWL2a of the second voltage line VWL2 and a fourth end portion e4' of the third portion VWL2c of the second voltage line VWL2 may be connected to the second portion VWL2b of the second voltage line VWL2.

The second voltage V2 received by each of the first end portion e1' of the first portion VWL2a of the second voltage line VWL2 and the third end portion e3' of the third portion VWL2c of the second voltage line VWL2 may be used to check whether the second pixels PX2 operate normally. While the display panel 10 is not tested, a first end portion e1' of the first portion VWL2a of the second voltage line VWL2 and a third end portion e3' of the third portion VWL2c of the second voltage line VWL2 may not receive the second voltage V2.

The eleventh transistors T11 may be respectively connected between the seventh connection nodes N7 and the third portion VWL1c of the first voltage line VWL1, and the twelfth transistors T12 may be respectively connected between the eighth connection nodes N8 and the second portion VWL1b of the first voltage line VWL1. The gates of the eleventh transistors T11 and the gates of the twelfth transistors T12 may be commonly connected to the first gate line GWL1.

The thirteenth transistors T13 may be respectively connected between the seventh connection nodes N7 and the third portion VWL2c of the second voltage line VWL2, and the fourteenth transistors T14 may be respectively connected between the eighth connection nodes N8 and the second portion VWL2b of the second voltage line VWL2. The gates of the thirteenth transistors T13 and the gates of the fourteenth transistors T14 may be commonly connected to the second gate line GWL2.

The fifteenth transistors T15 may be respectively connected between the ninth connection nodes N9 and the third voltage line VWL3, and the sixteenth transistors T16 may be respectively connected between the tenth connection nodes N10 and the third voltage line VWL3. The gates of the fifteenth transistors T15 and the gates of the sixteenth transistors T16 may be commonly connected to the third gate line GWL3.

The seventh transistors T17 may be respectively connected between the eleventh connection nodes N11 and the third portion VWL2c of the second voltage line VWL2, and the eighteenth transistors T18 may be respectively connected between the twelfth connection nodes N12 and the second portion VWL2b of the second voltage line VWL2. The gates of the seventh transistors T17 and the gates of the eighteenth transistors T18 may be commonly connected to the first gate line GWL1.

The nineteenth transistors T19 may be respectively connected between the eleventh connection nodes N11 and the third portion VWL1c of the first voltage line VWL1, and the twentieth transistors T20 may be respectively connected between the twelfth connection nodes N12 and the second portion VWL1b of the first voltage line VWL1. The gates of the nineteenth transistors T19 and the gates of the twentieth transistors T20 may be commonly connected to the second gate line GWL2.

Because the plurality of eleventh to twentieth transistors T11 to T20 may respectively correspond to the plurality of first to tenth transistors T1 to T10, a process of testing of the display panel 10 by using the plurality of the eleventh to twentieth transistors T11 to T20 may be applied in the same manner as the test process of the display panel 10 described above with reference to FIG. 7.

Figure 10:
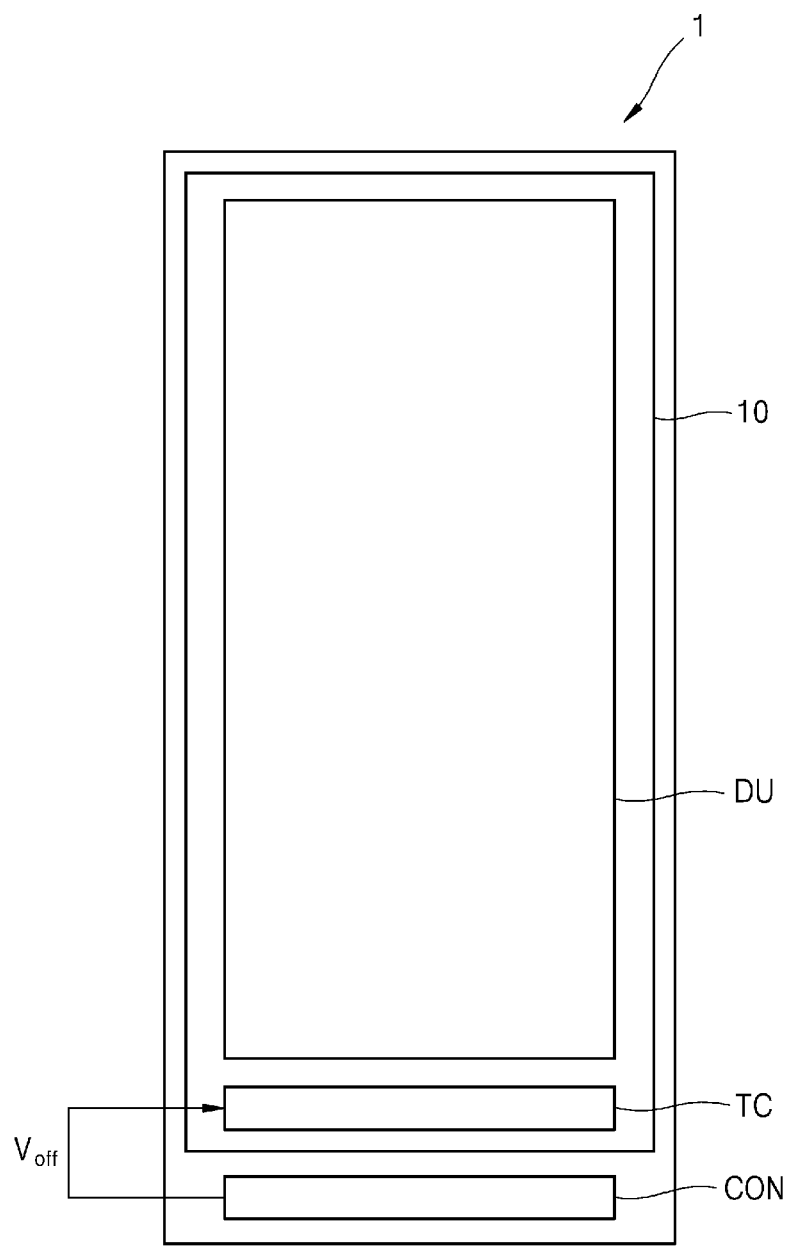
FIG. 10 is a block diagram schematically illustrating a display apparatus according to an embodiment.

FIG. 10 is a block diagram schematically illustrating a display apparatus according to an embodiment.

Referring to FIG. 10, a display apparatus 1 may include a display panel 10 and a controller CON. The display panel 10 may include a display unit DU and a test circuit TC. The display panel 10 may correspond to the display panel 10 illustrated in FIG. 1.

The display unit DU may correspond to the display area DA illustrated in FIG. 1. That is, a first area AR1, a second area AR2, and a third area AR3 may be defined in the display unit DU. The display unit DU may include a plurality of data lines DL, a plurality of scan lines SL, and a plurality of pixels PX. The display unit DU may display an image through the plurality of pixels PX.

The test circuit TC may correspond to each of the test circuits TC illustrated in FIGS. 3A to 9A. That is, the test circuit TC may include a plurality of transistors, a plurality of voltage lines, and a plurality of gate lines and may check whether the pixels PX of the display unit DU are defective during the test of the display panel 10.

The controller CON may be configured to turn off the plurality of transistors of the test circuit TC while the display unit DU displays an image. The controller CON may be configured to turn off the plurality of transistors of the test circuit TC while the display panel 10 is not tested. For example, as illustrated in FIG. 10, the controller CON may transmit a turn-off voltage Voff to the test circuit TC.

Figure 11:
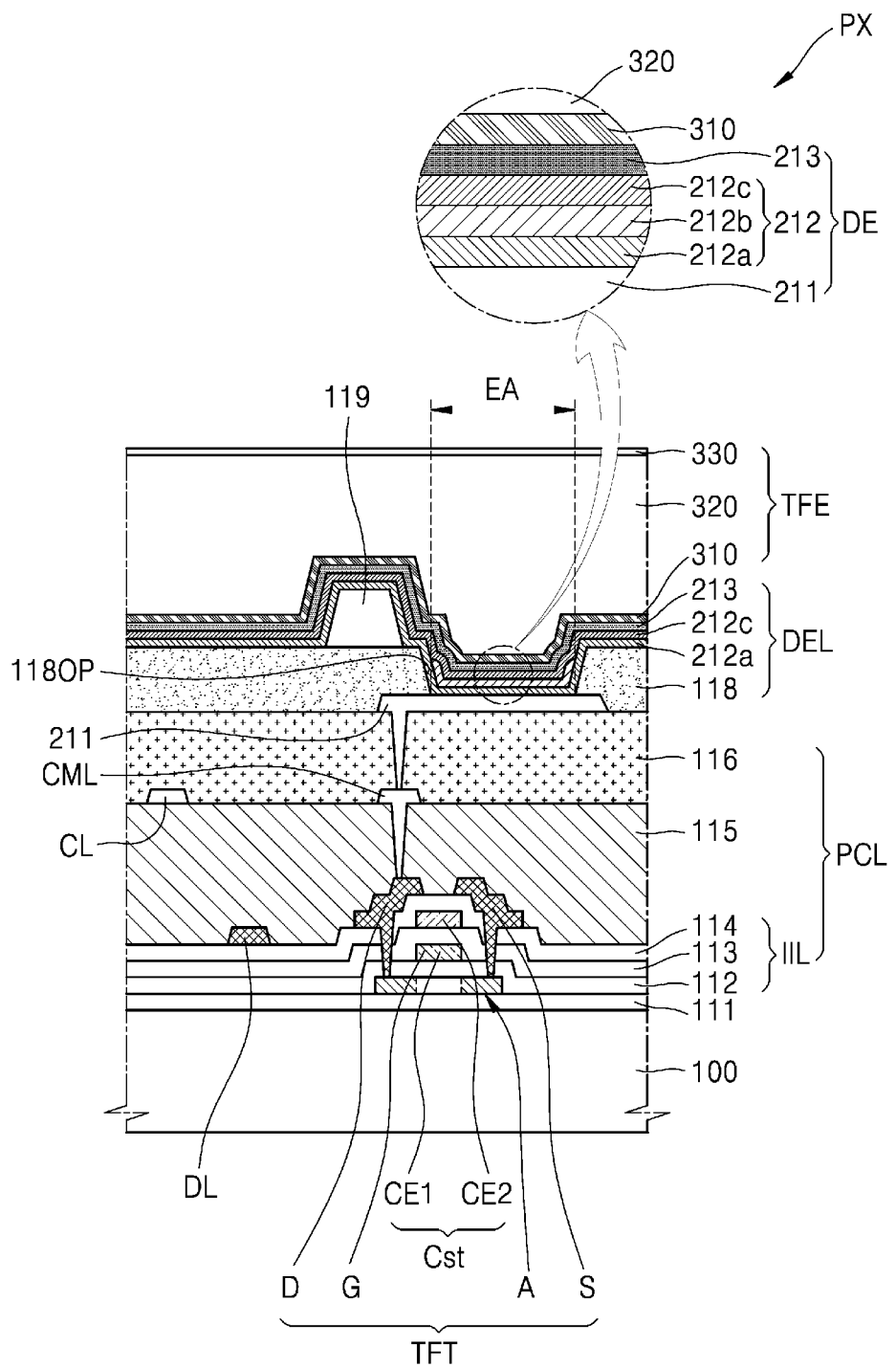
FIG. 11 is a cross-sectional view schematically illustrating a display panel according to an embodiment.

FIG. 11 is a cross-sectional view schematically illustrating a display panel according to an embodiment.

Particularly, FIG. 11 illustrates a cross-section of a pixel PX in the display panel, and some members thereof may be omitted. Hereinafter, a multilayer film stacked in a display apparatus will be described in detail with reference to FIG. 11.

Referring to FIG. 11, the display panel may include a substrate 100, a buffer layer 111, a pixel circuit layer PCL, a display element layer DEL, and a thin film encapsulation layer TFE.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multilayer structure including a barrier layer and a base layer including the above polymer resin.

The buffer layer 111 may include an inorganic insulating material such as silicon nitride, silicon oxynitride, and silicon oxide and may include a single layer or multiple layers including the inorganic insulating material.

The pixel circuit layer PCL may be arranged on the buffer layer 111. The pixel circuit layer PCL may include a thin film transistor TFT included in a pixel circuit, an inorganic insulating layer IIL arranged under and/or on the components of the thin film transistor TFT, a first planarization layer 115, and a second planarization layer 116. The inorganic insulating layer IIL may include a first gate insulating layer 112, a second gate insulating layer 113, and an interlayer insulating layer 114.

The thin film transistor TFT may include a semiconductor layer A, and the semiconductor layer A may include polysilicon. Alternatively, the semiconductor layer A may include amorphous silicon, may include an oxide semiconductor, or may include an organic semiconductor or the like. The semiconductor layer A may include a channel area, and a drain area and a source area respectively arranged on both sides of the channel area. A gate electrode G may overlap the channel area.

The gate electrode G may include a low-resistance metal material. The gate electrode G may include a conductive material including molybdenum (Mo), aluminum (Al), copper (Cu), titanium (Ti), or the like and may include a single layer or multiple layers including the above material.

The first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 113 may be provided to cover the gate electrode G. Like the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of a storage capacitor Cst may be arranged on the second gate insulating layer 113. The upper electrode CE2 may overlap the gate electrode G thereunder. In this case, the gate electrode G and the upper electrode CE2 overlapping each other with the second gate insulating layer 113 therebetween may form the storage capacitor Cst of the pixel circuit. That is, the gate electrode G may function as a lower electrode CE1 of the storage is capacitor Cst. As such, the storage capacitor Cst and the thin film transistor TFT may be formed to overlap each other. In some embodiments, the storage capacitor Cst may be formed not to overlap the thin film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or multiple layers including the above inorganic insulating material.

Each of a drain electrode D, a source electrode S, and a data line DL may be located on the interlayer insulating layer 114. Each of the drain electrode D, the source electrode S, and the data line DL may include a high-conductivity material. The drain electrode D, the source electrode S, and the data line DL may include a conductive material including molybdenum (Mo), aluminum (Al), copper (Cu), titanium (Ti), or the like and may include a single layer or multiple layers including the above material. In an embodiment, the drain electrode D, the source electrode S, and the data line DL may have a multilayer structure of Ti/Al/Ti.

The first planarization layer 115 may be arranged to cover the drain electrode D, the source electrode S, and the data line DL. The first planarization layer 115 may include an organic insulating layer. The first planarization layer 115 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

A connection electrode CML and a connection line CL may be arranged on the first planarization layer 115. In this case, the connection electrode CML may be connected to the drain electrode D or the source electrode S through a contact hole of the first planarization layer 115. Alternatively to what is shown in FIG. 11, the connection line CL may be connected to the data line DL through a contact hole of the first planarization layer 115. The connection electrode CML and the connection line CL may include a high-conductivity material. The connection electrode CML and the connection line CL may include a conductive material including molybdenum (Mo), aluminum (Al), copper (Cu), titanium (Ti), or the like and may include a single layer or multiple layers including the above material. In an embodiment, the connection electrode CML and the connection line CL may have a multilayer structure of Ti/Al/Ti.

FIG. 11 illustrates that the data line DL is located on the interlayer insulating layer 114 and the connection line CL is located on the first planarization layer 115; however, in other embodiments, the data line DL may be located on the first planarization layer 115 and the connection line CL may be located on the interlayer insulating layer 114.

The second planarization layer 116 may be arranged to cover the connection electrode CML and the connection line CL. The second planarization layer 116 may include an organic insulating layer. The second planarization layer 116 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

The display element layer DEL may be arranged on the pixel circuit layer PCL. The display element layer DEL may include a display element DE. The display element DE may include an organic light emitting diode (OLED). A pixel electrode 211 of the display element DE may be electrically connected to the connection electrode CML through a contact hole of the second planarization layer 116. FIG. 11 illustrates that the pixel electrode 211 of the display element DE is electrically connected to the thin film transistor TFT through the connection electrode CML; however, in other embodiments, the connection electrode CML may be omitted and the pixel electrode 211 of the display element DE may be directly connected to the thin film transistor TFT.

The pixel electrode 211 may include a conductive oxide such as indium tin oxide (ITO), indium zinc oxide (IZO), zinc oxide (ZnO), indium oxide (In2O3), indium gallium oxide (IGO), or aluminum zinc oxide (AZO). In other embodiments, the pixel electrode 211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In other embodiments, the pixel electrode 211 may further include a layer formed of ITO, IZO, ZnO, or In2O3 on/under the reflection layer.

A pixel definition layer 118 including an opening 118OP exposing a central portion of the pixel electrode 211 may be arranged on the pixel electrode 211. The pixel definition layer 118 may include an organic insulating material and/or an inorganic insulating material. The opening 118OP may define an emission area of light emitted from the display element DE (hereinafter referred to as an emission area EA). For example, the width of the opening 118OP may correspond to the width of the emission area EA of the display element DE.

A spacer 119 may be arranged on the pixel definition layer 118. The spacer 119 may be used to prevent damage to the substrate 100 in a manufacturing method of manufacturing the display apparatus. A mask sheet may be used to manufacture the display panel, and in this case, the spacer 119 may prevent a portion of the substrate 100 from being damaged or destroyed by the mask sheet as the mask sheet enters the opening 118OP of the pixel definition layer 118 or contacts the pixel definition layer 118 to deposit a deposition material on the substrate 100.

The spacer 119 may include an organic insulating material such as polyimide. Alternatively, the spacer 119 may include an inorganic insulating material such as silicon nitride or silicon oxide or may include an organic insulating material and an inorganic insulating material.

In an embodiment, the spacer 119 may include a different material than the pixel definition layer 118. In other embodiments, the spacer 119 may include the same material as the pixel definition layer 118, and in this case, the pixel definition layer 118 and the spacer 119 may be formed together in a mask process using a halftone mask or the like.

An intermediate layer 212 may be arranged on the pixel definition layer 118. The intermediate layer 212 may include an emission layer 212b arranged in the opening 118OP of the pixel definition layer 118. The emission layer 212b may include a high-molecular or low-molecular weight organic material for emitting light of a certain color.

A first functional layer 212a and a second functional layer 212c may be respectively arranged under and on the emission layer 212b. The first functional layer 212a may include, for example, a hole transport layer (HTL) or may include an HTL and a hole injection layer (HIL). The second functional layer 212c may be a component arranged on the emission layer 212b and may be optional. The second functional layer 212c may include an electron transport layer (ETL) and/or an electron injection layer (EIL). Like an opposite electrode 213 described below, the first functional layer 212a and/or the second functional layer 212c may be a common layer formed to entirely cover the substrate 100.

The opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer such as ITO, IZO, ZnO, or In2O3 on the (semi)transparent layer including the above material.

In some embodiments, a capping layer may be further arranged on the opposite electrode 213. The capping layer may include LiF, an inorganic material, and/or an organic material.

The thin film encapsulation layer TFE may be arranged on the opposite electrode 213. In an embodiment, the thin film encapsulation layer TFE may include at least one inorganic encapsulation layer and at least one organic encapsulation layer, and FIG. 11 illustrates that the thin film encapsulation layer TFE includes a first inorganic encapsulation layer 310, an organic encapsulation layer 320, and a second inorganic encapsulation layer 330.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acryl-based resin, epoxy-based resin, polyimide, polyethylene, or the like. In an embodiment, the organic encapsulation layer 320 may include acrylate.

A touch electrode layer may be arranged on the thin film encapsulation layer TFE, and an optical functional layer may be arranged on the touch electrode layer. The touch electrode layer may be configured to obtain coordinate information according to an external input, for example, a touch event. The optical functional layer may reduce the reflectance of light (external light) incident from the outside toward the display apparatus and/or may improve the color purity of light emitted from the display apparatus. In an embodiment, the optical functional layer may include a phase retarder and/or a polarizer. The phase retarder may be a film type or a liquid crystal coating type and may include a $\lambda/2$ phase retarder and/or a $\lambda/4$ phase retarder. The polarizer may also be a film type or a liquid crystal coating type. The film type may include a stretched synthetic resin film, and the liquid crystal coating type may include liquid crystals arranged in a certain arrangement. The phase retarder and the polarizer may further include a protection film.

In other embodiments, the optical functional layer may include a black matrix and color filters. The color filters may be arranged considering the color of light emitted from each of the pixels of the display apparatus. Each of the color filters may include a red, green, or blue pigment or dye. Alternatively, each of the color filters may further include quantum dots in addition to the above pigment or dye. Alternatively, some of the color filters may not include the above pigment or dye and may include scattering particles such as titanium oxide.

In other embodiments, the optical functional layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and accordingly, the external light reflectance may be reduced.

An adhesive member may be arranged between the touch electrode layer and the optical functional layer. The adhesive member may include a general one known in the art, without limitation. The adhesive member may include a pressure sensitive adhesive (PSA).

Although only the display panel and the display apparatus have been mainly described above, the embodiment described herein is not limited thereto. For example, a method of manufacturing the display panel and a method of manufacturing the display apparatus may also fall within the scope of the embodiments described herein.

As described above, according to an embodiment, it may be possible to implement a display panel and a display apparatus including the same, in which a particular color is prevented from being emphasized and displayed in a display area even when the display panel or the display apparatus operates normally when the display panel or the display apparatus is tested. However, the scope of the embodiments described herein is not limited to these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
    a substrate comprising a first area and a second area in which a plurality of first connection nodes and a plurality of second connection nodes are arranged, the first and second areas being separate from each other;
    a plurality of first data lines extending in a column direction on the first area;
    a plurality of second data lines extending in the column direction on the second area and respectively connected to the plurality of second connection nodes;
    a plurality of first connection lines respectively connecting the plurality of first data lines to the plurality of first connection nodes;
    a first voltage line comprising a first portion and a second portion spaced apart from each other in the column direction;
    a plurality of first transistors respectively connected between the plurality of first connection nodes and the first portion of the first voltage line;
    a plurality of second transistors respectively connected between the plurality of second connection nodes and the second portion of the first voltage line; and
    a first gate line connected to gates of the plurality of first transistors and gates of the plurality of second transistors.

2. The display panel of claim 1, wherein a first end portion of the first portion of the first voltage line is arranged to receive a first voltage, and
    a second end portion of the first portion of the first voltage line is connected to the second portion of the first voltage line.

3. The display panel of claim 1, wherein each of the plurality of first connection lines comprises:
    a first portion extending in a row direction; and
    a second portion extending in the column direction.

4. The display panel of claim 1, further comprising:
    a second voltage line comprising a first portion and a second portion spaced apart from each other in the column direction;
    a plurality of third transistors respectively connected between the plurality of first connection nodes and the first portion of the second voltage line;
    a plurality of fourth transistors respectively connected between the plurality of second connection nodes and the second portion of the second voltage line; and
    a second gate line commonly connected to gates of the plurality of third transistors and gates of the plurality of fourth transistors.

5. The display panel of claim 4, wherein a first end portion of the first portion of the second voltage line is arranged to receive a second voltage, and
    a second end portion of the first portion of the second voltage line is connected to the second portion of the second voltage line.

6. The display panel of claim 4, wherein a plurality of first gate signals for turning on the plurality of first transistors and the plurality of second transistors are applied to the first gate line,
    a plurality of second gate signals for turning on the plurality of third transistors and the plurality of fourth transistors are applied to the second gate line, and
    the plurality of first gate signals and the plurality of second gate signals are applied alternately in time with respect to each other.

7. The display panel of claim 4, further comprising:
    a plurality of first pixels respectively connected to the plurality of first data lines and the plurality of second data lines and emitting light of a first color; and
    a plurality of second pixels respectively connected to the plurality of first data lines and the plurality of second data lines and emitting light of a second color different from the first color,
    wherein the plurality of first pixels and the plurality of second pixels are alternately arranged in the column direction.

8. The display panel of claim 1, wherein a plurality of third connection nodes and a plurality of fourth connection nodes are further arranged in the second area, and
    the display panel further comprises:
    a plurality of third data lines extending in the column direction on the first area;
    a plurality of fourth data lines extending in the column direction on the second area and respectively connected to the plurality of fourth connection nodes;
    a plurality of second connection lines respectively connecting the plurality of third data lines to the plurality of third connection nodes;
    a third voltage line connected to each of the plurality of third data lines and the plurality of fourth data lines;
    a plurality of third transistors respectively connected between the plurality of third connection nodes and the third voltage line;
    a plurality of fourth transistors respectively connected between the plurality of fourth connection nodes and the third voltage line; and
    a second gate line connected to gates of the plurality of third transistors and gates of the plurality of fourth transistors.

9. The display panel of claim 8, further comprising:
    a plurality of first pixels respectively connected to the plurality of first data lines and the plurality of second data lines and emitting light of a first color; and
    a plurality of third pixels respectively connected to the plurality of third data lines and the plurality of fourth data lines and emitting light of a third color,
    wherein the plurality of first pixels and the plurality of third pixels are alternately arranged in a row direction.

10. The display panel of claim 1, wherein a plurality of third connection nodes and a plurality of fourth connection nodes are further arranged in the second area, and
    the display panel further comprises:
    a plurality of third data lines extending in the column direction on the first area;
    a plurality of fourth data lines extending in the column direction on the second area and respectively connected to the plurality of fourth connection nodes;

a plurality of second connection lines respectively connecting the plurality of third data lines to the plurality of third connection nodes;

a second voltage line comprising a first portion and a second portion spaced apart from each other in the column direction;

a plurality of third transistors respectively connected between the plurality of third connection nodes and the first portion of the second voltage line; and a plurality of fourth transistors respectively connected between the plurality of fourth connection nodes and the second portion of the second voltage line, wherein the first gate line is connected to gates of the plurality of third transistors and gates of the plurality of fourth transistors.

11. The display panel of claim 10, wherein the plurality of first data lines and the plurality of third data lines are alternately arranged in a row direction, and the plurality of second data lines and the plurality of fourth data lines are alternately arranged in the row direction.

12. The display panel of claim 11, further comprising:

a plurality of first pixels respectively connected to the plurality of first data lines and the plurality of second data lines and configured to emit light of a first color; and a plurality of second pixels respectively connected to the plurality of third data lines and the plurality of fourth data lines and configured to emit light of a second color different from the first color.

13. The display panel of claim 10, further comprising:

a plurality of fifth transistors respectively connected between the plurality of first connection nodes and the first portion of the second voltage line;

a plurality of sixth transistors respectively connected between the plurality of second connection nodes and the second portion of the second voltage line;

a plurality of seventh transistors respectively connected between the plurality of third connection nodes and the first portion of the first voltage line;

a plurality of eighth transistors respectively connected between the plurality of fourth connection nodes and the second portion of the first voltage line; and a second gate line connected to gates of the plurality of fifth transistors, gates of the plurality of sixth transistors, gates of the plurality of seventh transistors, and gates of the plurality of eighth transistors.

14. The display panel of claim 1, wherein the substrate further comprises a third area spaced apart from the first area by the second area, a plurality of third connection nodes and a plurality of fourth connection nodes are further arranged in the second area, the first voltage line further comprises a third portion spaced apart from the second portion in the column direction, and the display panel further comprises:

a plurality of third data lines extending in the column direction on the third area;

a plurality of fourth data lines extending in the column direction on the second area and respectively connected to the plurality of fourth connection nodes;

a plurality of second connection lines respectively connecting the plurality of third data lines to the plurality of third connection nodes;

a plurality of third transistors respectively connected between the plurality of third connection nodes and the third portion of the first voltage line; and a plurality of fourth transistors respectively connected between the plurality of fourth connection nodes and the second portion of the first voltage line, wherein the first gate line is connected to gates of the plurality of third transistors and gates of the plurality of fourth transistors.

15. The display panel of claim 14, further comprising:

a second voltage line comprising a first portion, a second portion spaced apart from the first portion in the column direction, and a third portion spaced apart from the second portion in the column direction;

a plurality of fifth transistors respectively connected between the plurality of first connection nodes and the first portion of the second voltage line;

a plurality of sixth transistors respectively connected between the plurality of second connection nodes and the second portion of the second voltage line;

a plurality of seventh transistors respectively connected between the plurality of third connection nodes and the third portion of the second voltage line;

a plurality of eighth transistors respectively connected between the plurality of fourth connection nodes and the second portion of the second voltage line; and a second gate line connected to gates of the plurality of fifth transistors, gates of the plurality of sixth transistors, gates of the plurality of seventh transistors, and gates of the plurality of eighth transistors.

\* \* \* \* \*